(12) United States Patent
Yamazaki et al.

(10) Patent No.: US 7,160,784 B2
(45) Date of Patent: Jan. 9, 2007

(54) METHOD OF MANUFACTURING A SEMICONDUCTOR FILM WITH LITTLE WARP

(75) Inventors: Shunpei Yamazaki, Atsugi (JP); Toru Mitsuki, Atsugi (JP); Tamae Takano, Atsugi (JP)

(73) Assignee: Semiconductor Energy Laboratory Co. Ltd., Kanagawa-ken (JP)

( * ) Notice: Subject to any disclaimer, the term of this patent is extended or adjusted under 35 U.S.C. 154(b) by 0 days.

(21) Appl. No.: 10/081,767

(22) Filed: Feb. 25, 2002

(65) Prior Publication Data

US 2002/0119633 A1 Aug. 29, 2002

(30) Foreign Application Priority Data

Feb. 28, 2001 (JP) .................................. 2001-055383
Feb. 28, 2001 (JP) .................................. 2001-055436

(51) Int. Cl.
*H01L 21/00* (2006.01)

(52) U.S. Cl. .................. 438/308; 438/162; 438/164; 438/166

(58) Field of Classification Search ......... 438/162–167, 438/308
See application file for complete search history.

(56) References Cited

U.S. PATENT DOCUMENTS

| 4,256,681 A | 3/1981 | Lindmayer |
| 4,814,292 A | 3/1989 | Sasaki et al. |
| 5,529,937 A | 6/1996 | Zhang et al. |
| 5,569,610 A | 10/1996 | Zhang et al. |
| 5,639,698 A | 6/1997 | Yamazaki et al. |
| 5,643,826 A * | 7/1997 | Ohtani et al. ............. 438/162 |
| 5,663,077 A | 9/1997 | Adachi et al. |

(Continued)

FOREIGN PATENT DOCUMENTS

| EP | 0 651 431 A2 | 5/1995 |
| JP | 07-183540 A | 7/1995 |
| JP | 11-074536 A | 3/1999 |
| JP | 2000-114172 | 4/2000 |
| JP | 2000-114173 | 4/2000 |
| JP | 2000-114526 | 4/2000 |
| JP | 2000-114527 | 4/2000 |

OTHER PUBLICATIONS

Kimura et atl., "Device Simulation of Interface Roughness in Laser–Crystallized p–Si TFT's", pp. 263–266, 1999, AM–LCD.

(Continued)

*Primary Examiner*—Thanh Nguyen
(74) *Attorney, Agent, or Firm*—Nixon Peabody LLP; Jeffrey L. Costellia

(57) ABSTRACT

When a laser beam is irradiated onto a semiconductor film, a steep temperature gradient is produced between a substrate and the semiconductor film. For this reason, the semiconductor film contracts, so that a warp in the film occurs. Therefore, the quality of a resulting crystalline semiconductor film sometimes deteriorates. According to the present invention, it is characterized in that, after laser beam crystallization on the semiconductor film, heat treatment is carried out so as to reduce the warp in the film. Since the substrate contracts by the heat treatment, the warp in the semiconductor film is lessened, so that the physical properties of the semiconductor film can be improved.

47 Claims, 22 Drawing Sheets

U.S. PATENT DOCUMENTS

| | | | |
|---|---|---|---|
| 5,773,327 | A | 6/1998 | Yamazaki et al. |
| 5,824,573 | A | 10/1998 | Zhang et al. |
| 5,854,096 | A | 12/1998 | Ohtani et al. |
| 5,879,977 | A | 3/1999 | Zhang et al. |
| 5,904,770 | A | 5/1999 | Ohtani et al. |
| 5,907,770 | A * | 5/1999 | Yamazaki et al. |
| 5,923,962 | A | 7/1999 | Ohtani et al. |
| 5,923,997 | A | 7/1999 | Mitanaga et al. |
| 5,948,496 | A | 9/1999 | Kinoshita et al. |
| 5,953,597 | A | 9/1999 | Kusumoto et al. |
| 6,014,944 | A | 1/2000 | Aklufi et al. |
| 6,184,068 | B1 | 2/2001 | Ohtani et al. |
| 6,197,623 | B1 * | 3/2001 | Joo et al. |
| 6,281,057 | B1 | 8/2001 | Aya et al. |
| 6,285,042 | B1 | 9/2001 | Ohtani et al. |
| 6,319,761 | B1 | 11/2001 | Zhang et al. |
| 6,326,248 | B1 | 12/2001 | Ohtani et al. |
| 6,335,541 | B1 | 1/2002 | Ohtani et al. |
| 6,509,579 | B1 | 1/2003 | Takeya et al. |
| 6,559,036 | B1 | 5/2003 | Ohtani et al. |
| 2001/0003659 | A1 | 6/2001 | Aya et al. |
| 2002/0013114 | A1 | 1/2002 | Ohtani et al. |

OTHER PUBLICATIONS

Abe et al., "High–Performance Poly–Crystalline Silicon TFTs Fabricated Using the SPC and ELA Methods", pp. 85–88, Jul. 9–10 1998, AM–LCD.

Specifications and Drawings for application Ser. No. 10/078,240, "Method of Manufacturing a Semiconductor Device" Filing Date: Feb. 20, 2002, Inventors: Shunpei Yamazaki et al.

Specifications and Drawings for application Ser. No. 10/056,054, "Method for Manufacturing a Semiconductor Device".

* cited by examiner

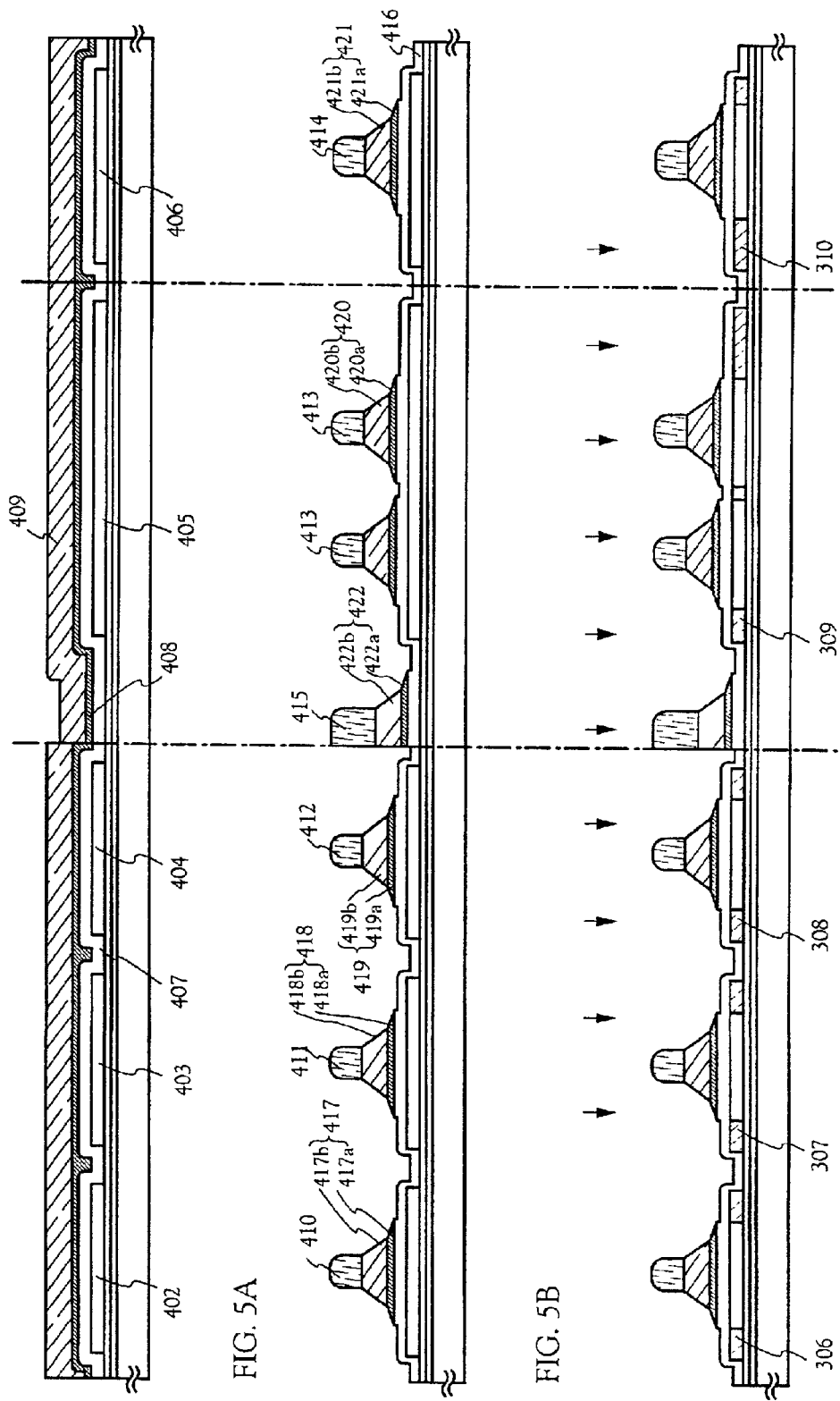

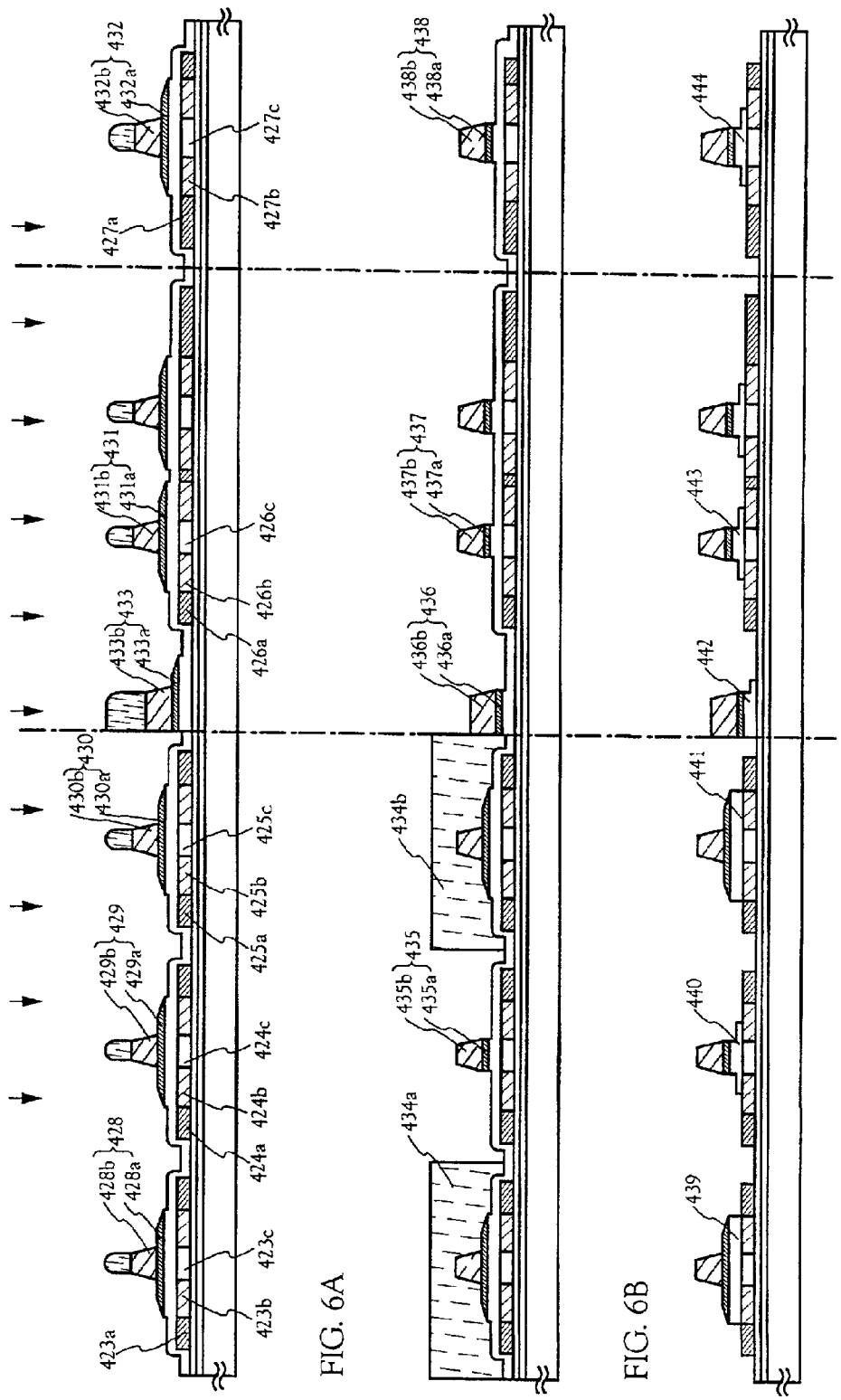

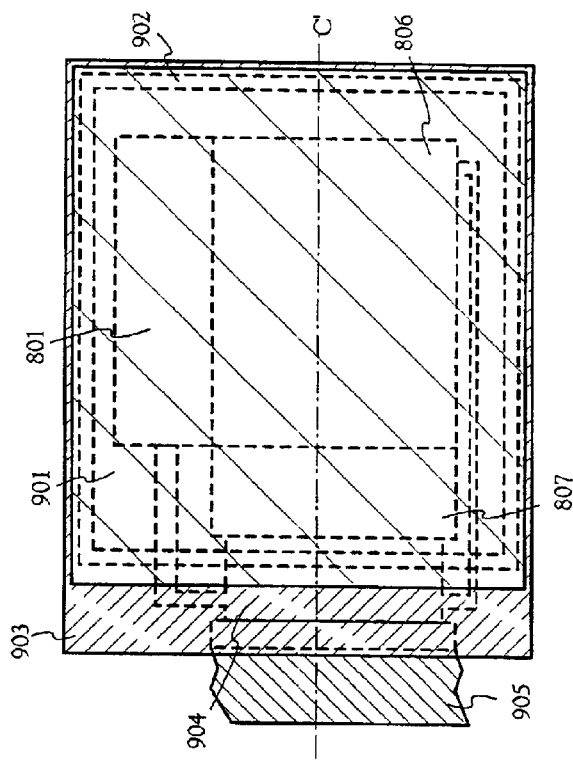
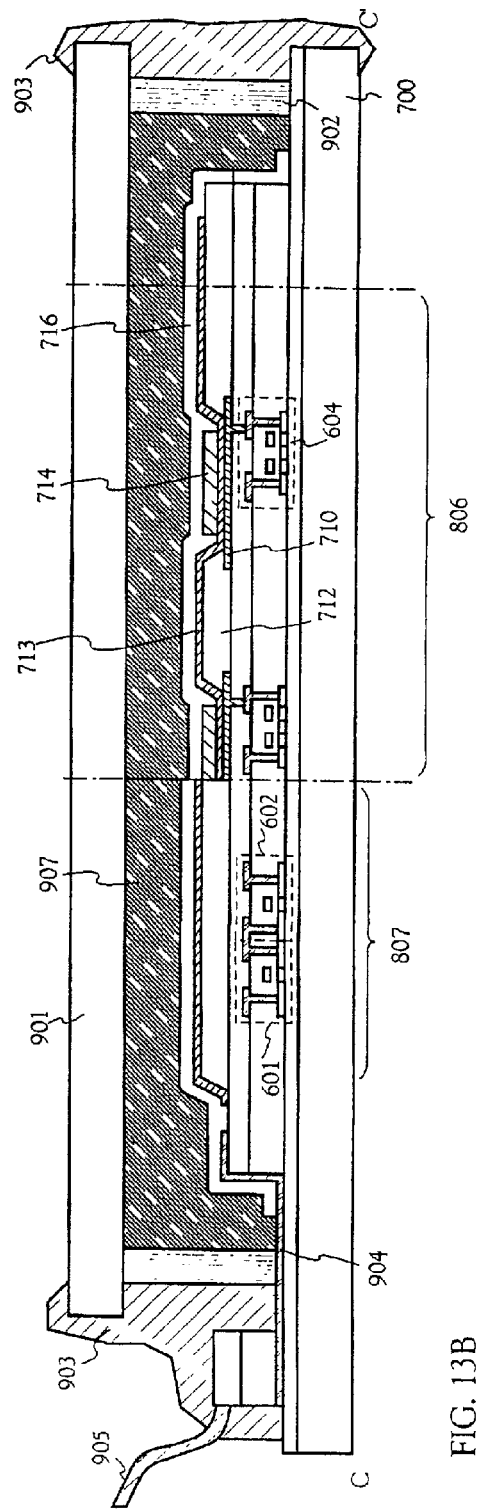
FIG. 13A
FIG. 13B

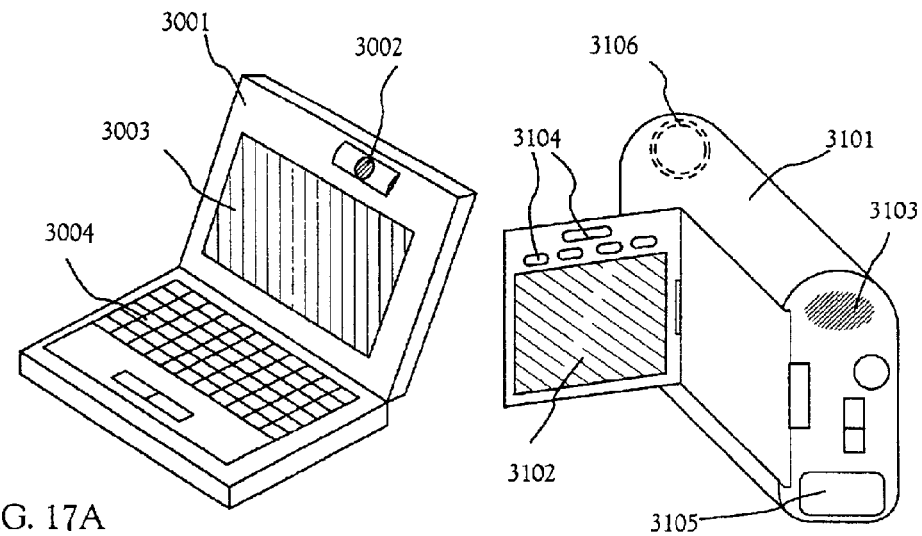
FIG. 17A
FIG. 17B
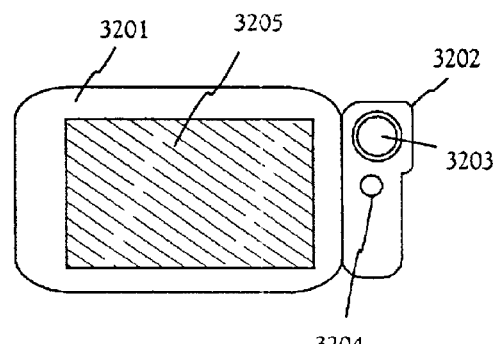
FIG. 17C
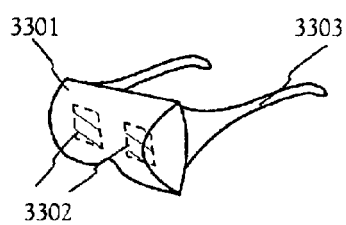
FIG. 17D
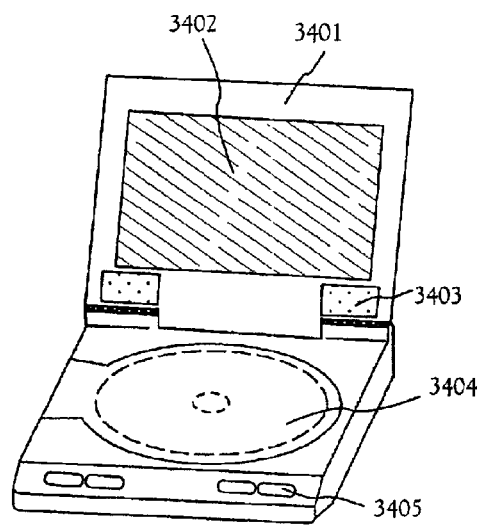
FIG. 17E
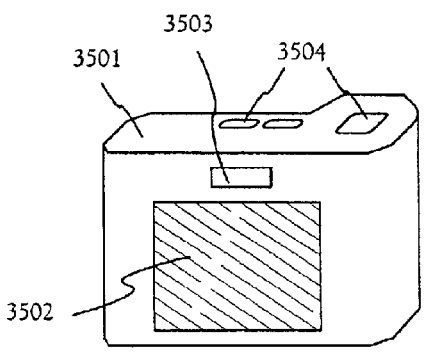
FIG. 17F

METHOD OF MANUFACTURING A SEMICONDUCTOR FILM WITH LITTLE WARP

BACKGROUND OF THE INVENTION

1. Field of the Invention

The present invention relates to a method of manufacturing a semiconductor device, which includes a process of annealing a semiconductor film using a laser beam (hereinafter referred to as laser annealing). Semiconductor devices herein include electro-optical devices such as liquid crystal display devices and light emitting devices, and electronic equipment that contains the electro-optical devices as components.

2. Description of the Related Art

In recent years, a technique of crystallizing a semiconductor film formed over an insulating substrate made of glass or the like, and improving the crystallinity of the film has been extensively studied. In order to accomplish the objectives described above, the film is heated and/or laser annealed. For forming the semiconductor film, it is a common practice to use silicon. In this specification, laser crystallization refers to a method of crystallizing a semiconductor film by means of the laser beam to obtain a crystalline semiconductor film. Note that, in this specification, the crystalline semiconductor film refers to the semiconductor film in which crystallized areas exist.

The crystalline semiconductor film formed by the crystallization method as described above possesses high mobility. For this reason, the crystalline semiconductor film is increasingly employed in various devices such as monolithic type liquid crystal electro-optical devices. In these electro-optical devices, thin film transistors (TFTs) are formed by means of this crystalline semiconductor film, and TFTs for driving pixels and TFTs for driver circuits are formed on a single glass substrate.

As described above, the crystalline semiconductor film has extremely better properties than an amorphous semiconductor film. For this reason, the above-mentioned study has been conducted. For crystallizing the amorphous semiconductor film by heating, for example, the heating temperature of 600° C. or higher and the heating time of 10 hours or longer, preferably 20 hours or longer were required. Among the substrates that can withstand the crystallization conditions is a quartz substrate, for example. The quartz substrate, however, is very expensive, and it was extremely difficult to process the quartz substrate into a large-area substrate in particular. The large-area substrate is especially essential for increasing production efficiency. Recently, there is a remarkable trend toward larger-area substrates so as to improve the production efficiency. Therefore, on production lines of a factory to be newly constructed, a substrate size of 600=720 mm is becoming standard.

Among glass substrates that have a comparatively high melting point is a 1737 glass substrate. A warping point of the 1737 glass substrate is 667° C., a cooling point or a temperature from which a change in shape of the 1737 glass substrate becomes manifest is 721° C., and a melting point of the 1737 glass substrate is 975° C. When the amorphous semiconductor film was formed on this glass substrate and then placed in the atmosphere at 600° C. for 20 hours, a contraction in the substrate could be recognized. However, any deformation that would affect the processes of manufacturing a semiconductor device was not seen in the substrate. The 20-hour heating time, however, was too long in consideration of volume production.

In order to solve the problems as described above, a new crystallization method was devised. Details of this method are described in Japanese Patent Application Laid-open Hei 7-183540. Now, this method will be briefly described. First, a very small amount of nickel, palladium, lead or the like is introduced into an amorphous semiconductor film for doping. In order to perform the doping process, a plasma CVD method, a vapor deposition method, an ion implantation method, a sputtering method, a solution applying method or the like should be used. After the doping process, when the amorphous semiconductor film is placed in a nitrogen atmosphere at 550° C. for four hours, for example, a crystalline semiconductor film with satisfactory characteristics can be obtained. Incidentally, the heating temperature and time most suitable for crystallization depends on the doping amount of the element and the states of the amorphous semiconductor film.

The above was a description about the method of crystallizing the amorphous semiconductor film by heating. On contrast therewith, since crystallization by laser annealing can impart high energy to the amorphous semiconductor film alone without excessively increasing the temperature of the substrate, it can also be employed for a plastic substrate or the like as well as a glass substrate having a low warping point.

A high-power pulse laser beam such as an excimer laser beam is employed for laser annealing. The laser beam is processed by an optical system so as to form the beam shape of a square spot several by several centimeters square (rectangular shape) or a line of ten centimeters or longer (linear shape) on an irradiation plane. Then, scanning by the laser beam is performed, or the position of the laser beam irradiation is moved relative to the irradiation plane. This method provides increased productivity and is more excellent from a commercial point of view. For this reason, this method is preferably used.

When the linear laser beam in particular is employed, laser beam irradiation onto the entire irradiation plane can be performed just by scanning in a direction perpendicular to the longitudinal direction of the linear laser beam. On contrast therewith, when the laser beam that forms the spot shape on the irradiation plane is employed, back-and-forth and left-and-right scanning is required. For this reason, the linear laser beam provides higher productivity. Since the direction perpendicular to the longitudinal direction of the laser beam is the most efficient scanning direction, this direction is employed for scanning. Due to the higher productivity, use of the linear laser beam obtained by processing the pulse oscillation excimer laser by an appropriate optical system in the laser annealing method is becoming mainstream in the technology of manufacturing a liquid crystal display device using TFTs.

For forming the crystalline semiconductor film, there is also provided a method of crystallizing the amorphous semiconductor film by heating and then further crystallizing the resultant film by laser annealing. With this method, the characteristics of the semiconductor film can be improved more than in the case where crystallization is performed either by heating or laser annealing. In this method, in order to obtain the improved characteristics, it is necessary to optimize both heating conditions and laser annealing conditions. Manufacturing of thin film transistors (TFTs) using the crystalline semiconductor film obtained by the above-mentioned method greatly improves the electrical characteristics of the TFTs.

However, since the crystallization method by means of laser beam irradiation can impart high energy to the semiconductor film without excessively increasing the temperature of the substrate, an abrupt temperature gradient is produced between the substrate and the semiconductor film. Consequently, the semiconductor film contracts under a tensile stress and then becomes warped.

In addition, the semiconductor film becomes more compact by crystallization. This phenomenon can be confirmed from a decrease in thickness of the film. As described above, the semiconductor film contracts by crystallization, thereby becoming a factor for bringing about warps in the film.

These warps can also be confirmed by conducting Raman scattering spectroscopy, and then detecting a shift in a peak in the Raman spectrum after the laser beam irradiation.

Though these contractions are not significant at the stage where the substrate is transported, they have adverse effects on the characteristics of the semiconductor device of an insulating gate type. To take an example, a potential barrier or trapping levels resulting from the warp of the semiconductor film are induced, which leads to a higher interface level between an active layer and a gate insulating film. Further, when the semiconductor film is warped, uniform application of an electric field cannot be performed, which leads to a malfunction of the semiconductor device. In addition, the warp in the surface of the semiconductor film impairs the flatness of the gate insulating film deposited by the sputtering method or the CVD method, and causes faulty insulation or the like, thereby reducing reliability. A surface scattering effect is pointed out as one of the factors for determining the TFT's field effect mobility. The flatness of the interface between the active layer and the gate insulating film of the TFT greatly affects the field effect mobility. The flatter the interface is, the lesser the TFT is not affected by scattering, so that high field effect mobility can be obtained. In this way, the warp in the semiconductor film affects all the characteristics of the TFT, thereby changing even production yields.

SUMMARY OF THE INVENTION

The present invention has been made to solve the above-mentioned problems. It is therefore an object of the present invention to provide a method of forming a semiconductor film with little warp and then manufacturing a semiconductor device that uses the semiconductor film.

According to a method of manufacturing a semiconductor device of the present invention, after a semiconductor film is crystallized by a laser beam, heat treatment is performed, whereby a warp formed by laser beam irradiation is lessened. As already described, laser beam irradiation forms the warp in the semiconductor film. (FIG. 1B) Thereafter, when the heat treatment is carried out, the semiconductor film already treated at a high temperature hardly undergoes a change. However, a substrate that has not been treated at a high temperature by the processes carried out so far contracts. (FIG. 1C) The warp in the semiconductor film, resulting from laser beam irradiation can thus be lessened, so that the physical properties of the semiconductor film can be improved.

The method of manufacturing a semiconductor device according to the present invention comprises the steps of: irradiating a laser beam onto an amorphous semiconductor film to form a crystalline semiconductor film; and carrying out heat treatment to reduce a warp in the crystalline semiconductor film formed by irradiation of the laser beam.

In the manufacturing method, the heat treatment is a thermal annealing method that uses an annealing furnace or an RTA (Rapid Thermal Annealing) method.

The RTA method is the method of heating the substrate rapidly with a lamp to carry out heat treatment in a short time. In this specification, light radiated from the lamp is referred to as lamp light. The lamp light is radiated from the upper and/or lower side of the substrate. Further, the lamp light is the light radiated from a halogen lamp, a metal halide lamp, a xenon arc lamp, a carbon arc lamp, a high pressure sodium lamp, or a high pressure mercury lamp.

Further, in the manufacturing method, the heating temperature of the heat treatment is 500° C. or higher.

Furthermore, in the manufacturing method, the heating time of the heat treatment is from one to 30 minutes.

According to another method of manufacturing a semiconductor device of the present invention, after laser crystallization is performed on a semiconductor film that has been partially crystallized by first heat treatment, second heat treatment is carried out, whereby a warp formed by laser beam irradiation is lessened. As already described, laser beam irradiation forms the warp in the semiconductor film. (FIG. 1B) Thereafter, when the heat treatment is carried out, the semiconductor film already treated at a high temperature hardly undergoes a change. However, since a substrate is exposed to the highest temperature of all the processes carried out so far, it contracts. (FIG. 1C) The warp in the semiconductor film, resulting from laser beam irradiation can thus be lessened, so that the physical properties of the semiconductor film can be improved.

The method of manufacturing a semiconductor device according to the present invention comprises the steps of: introducing a metal element into an amorphous semiconductor film to carry out the first heat treatment; irradiating a laser beam onto the amorphous semiconductor film to form a crystalline semiconductor film; and carrying out the second heat treatment to reduce a warp in the crystalline semiconductor film formed by radiation of the laser beam.

In the manufacturing method, the first and second heat treatments are the thermal annealing method that uses the annealing furnace or the RTA method.

The RTA method is the method of heating the substrate rapidly with the lamp to carry out heat treatment in a short time. In this specification, light radiated from the lamp is referred to as lamp light. The lamp light is radiated from the upper and/or lower side of the substrate. Further, the lamp light is the light radiated from the halogen lamp, metal halide lamp, xenon arc lamp, carbon arc lamp, high pressure sodium lamp, or high pressure mercury lamp.

Further, in the manufacturing method, the heating temperature of the second heat treatment is higher than the heating temperature of the first heat treatment. With this arrangement, the substrate is exposed to the highest temperature of all the processes carried out so far, so that the substrate contracts. For this reason, the warp formed by laser beam irradiation can be lessened.

Furthermore, in the manufacturing method, the heating time of the second heat treatment is from one to 30 minutes.

Moreover, in the manufacturing method, the metal element is one or a plurality of the elements selected from the group consisting of Fe, Co, Ni, Ru, Rh, Pd, Os, Ir, Pt, Cu, Ag, Au, Sn and Sb.

BRIEF DESCRIPTION OF THE DRAWINGS

FIGS. 5A to 5C are cross-sectional views showing the process of manufacturing pixel TFTs and driver circuit TFTs of Embodiment 7;

FIGS. 6A to 6C are cross-sectional views showing the process of manufacturing pixel TFTs and driver circuit TFTs of Embodiment 7;

FIGS. 13A and 13B are a top view of a light emitting device and a cross-sectional view showing the structure of a driver circuit and a pixel portion in the light emitting device, respectively, of Embodiment 10;

FIGS. 17A to 17F show examples of electronic apparatuses of Embodiment 14;

DETAILED DESCRIPTION OF THE PREFERRED EMBODIMENTS

[Embodiment Mode 1]

Figure 1A:
FIGS. 1A to 1D are cross-sectional views showing a concept of Embodiment 1.
Figure 1B:
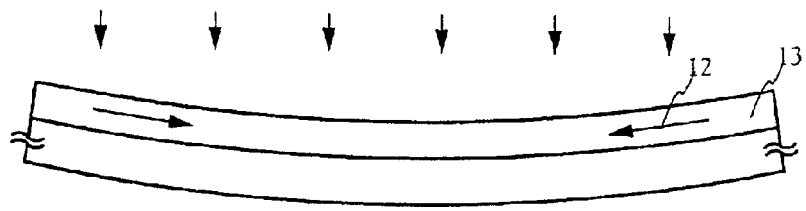
Figure 1C:
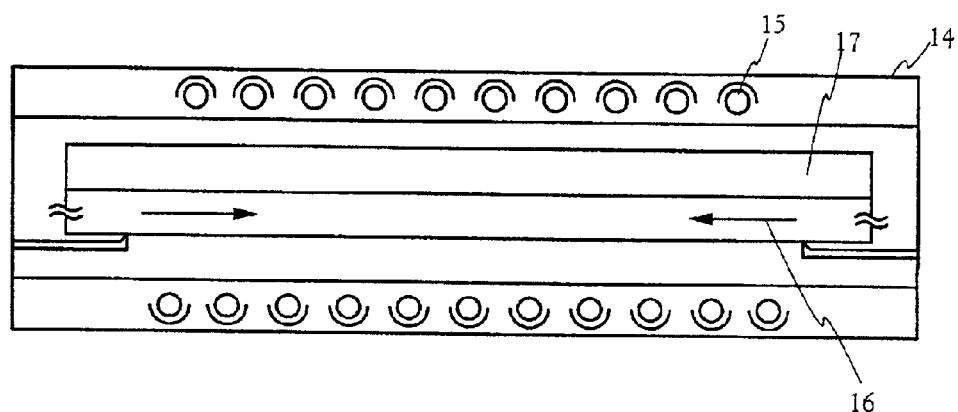
Figure 1D:
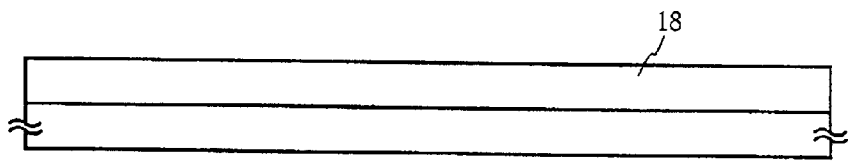

Embodiment Mode 1 of the present invention will be described with reference to FIGS. 1A to 1D.

First, a base insulating film (not shown) is formed on a substrate 10. A glass substrate or a quartz substrate having transmissivity is employed as the substrate 10. As the base insulating film, an insulating film such as a silicon oxide film, a silicon nitride film, or a silicon oxynitride film is formed. The structure of the base insulating film is not limited to a single layer. Lamination of at least two layers of the insulating films may also be employed. Further, the base insulating film may not be formed.

Next, a semiconductor film 11 is formed on the base insulating film. (FIG. 1A) The semiconductor film 11 is formed by depositing the amorphous semiconductor film using the well-known means such as a sputtering method, an LPCVD method or a plasma CVD method. The semiconductor film 11 is formed to have a thickness of 25 to 80 nm (preferably 30 to 60 nm). Any material can be used for the semiconductor film. However, preferably, silicon or an alloy of silicon and germanium (SiGe) should be employed.

Then, a crystalline semiconductor film is formed by laser crystallization. (FIG. 1B) A crystalline semiconductor film 13 that has contracted under a tensile stress 12 by laser beam irradiation is formed. Incidentally, it is preferable that, before laser crystallization, hydrogen contained in the semiconductor film is released. When heat treatment is carried out for approximately one hour at 400 to 500° C. to reduce the amount of contained hydrogen to 5% or less of the total number of atoms contained in the semiconductor film and then crystallization is performed, the surface of the film can be prevented from becoming rough. Generally, when the amorphous semiconductor film is formed by the sputtering method or the LPCVD method, the film contains a lower concentration of hydrogen than the amorphous semiconductor film formed by the plasma CVD method. However, even the amorphous semiconductor film formed by the plasma CVD method has a low concentration of hydrogen if formed at 400° C. or higher.

In the laser crystallization method, an excimer laser, YAG laser, $YVO_4$ laser, $YAlO_3$ laser or YLF laser of a pulse oscillation type or a continuous emission type can be employed. When using these lasers, it is efficient to converge laser beams radiated from a laser oscillator into a linear form by means of an optical system and then irradiate the converged beam onto the semiconductor film. Crystallization conditions should be selected by an operator as necessary. When using the excimer laser, a pulse oscillation frequency should be 300 Hz, and a laser energy density should be 100 to 800 mJ/cm², typically 200 to 700 mJ/cm². When using the YAG laser, the second harmonic emitted from the YAG laser is used. Then, the pulse oscillation frequency should be one to 300 Hz, and the laser energy density should be 300 to 1000 mJ/cm², typically 350 to 800 mJ/cm². Then, the laser beams that have been converged into the linear form with their width of 100 to 1000 μm, for example, 400 μm should be irradiated onto the entire substrate surface. In this case, laser beam irradiation may also be performed with a 50–98% overlapping ratio of the beams that have been converted into the linear form.

Laser crystallization can be performed in the air, in the atmosphere of an inert gas such as nitrogen, or in a reduced pressure atmosphere.

Next, heat treatment by thermal annealing using the annealing furnace or the RTA method is carried out. (FIG. 1C) Thermal annealing using the annealing furnace should be performed for one to 30 minutes at a temperature of 500° C. or higher, preferably in the range of 550 to 575° C. Reference numeral 14 denotes an RTA apparatus. When using the RTA method as well, the heat treatment should be carried out for one to 30 minutes at a temperature of 500° C. or higher. When using the RTA method, the heat treatment should be carried out in the nitrogen atmosphere, for example, with 11 infrared halogen lamps 15 provided under the substrate and ten infrared halogen lamps 15 provided over the substrate turned on. In the RTA method, a momentary increase in temperature can be effected. However, temperature adjustment may also be performed during the heat treatment with a temperature rising rate or temperature lowering rate of 30 to 300° C. per minute. The heat supplied from the halogen lamps, which is measured by a thermocouple embedded in a silicon wafer, is in the temperature range of 700 to 1300° C. However, optimum heat treatment conditions differ, depending on the states of the substrate and the semiconductor film. Thus, the operator should determine the optimum heat treatment conditions as necessary.

In this embodiment mode, the heat treatment was carried out in the nitrogen atmosphere. However, the inert gas such as helium (He), neon (Ne), or argon (Ar) may also be employed. The halogen lamps were herein used as a light source. However, it is also preferable that an ultraviolet lamp such as a xenon lamp is employed as the light source.

This heat treatment causes the substrate to contract in a direction indicated by reference numeral 16. Thus, contraction of the semiconductor film 13 resulting from laser beam irradiation is lessened, so that the semiconductor film 17 is obtained.

Then, patterning is performed to form a semiconductor layer 18 of a desired shape. Thereafter, if TFTs are manufactured by using the semiconductor layer thus obtained, their electrical characteristics will become excellent.

[Embodiment Mode 2]

Embodiment Mode 2 of the present invention will be described with reference to FIGS. 20A to 20E.

First, the base insulating film (not shown) is formed on a substrate 30. The glass substrate or the quartz substrate having transmissivity is employed as the substrate 30. As the base insulating film, the insulating film such as the silicon oxide film, silicon nitride film, or silicon oxynitride film is formed. The structure of the base insulating film is not limited to a single layer. Lamination of at least two layers of the insulating films may also be employed. Further, the base insulating film may not be formed.

Next, a semiconductor film 31 is formed on the base insulating film. (FIG. 20A) The semiconductor film 31 is formed by depositing the amorphous semiconductor film using the well-known means such as the sputtering method, LPCVD method or plasma CVD method. The semiconductor film 31 is formed to have a thickness of 25 to 80 nm (preferably 30 to 60 nm). Any material can be used for the semiconductor film. However, preferably, silicon or the alloy of silicon and germanium (SiGe) is employed.

Thereafter, the semiconductor film 31 is added with a metal element for promoting crystallization by using the well-known means such as the sputtering method or the solution applying method to form a metal containing layer 32. As the metal element, one or a plurality of metal elements selected from the group consisting of Fe, Co, Ni, Ru, Rh, Pd, Os, Ir, Pt, Cu, Ag, Au, Sn and Sb are employed.

Then, the first heat treatment is carried out to partially crystallize the semiconductor film to thereby form a first crystalline semiconductor film 33. (FIG. 20B) Thermal annealing that uses the annealing furnace or the RTA method may be employed as the heat treatment.

Then, a second crystalline semiconductor film 35 is formed by laser crystallization. (FIG. 20C) The crystalline semiconductor film 35 that has contracted under a tensile stress 34 by laser irradiation is formed. Incidentally, it is preferable that, before laser crystallization, hydrogen contained in the semiconductor film is released. When the heat treatment is carried out for approximately one hour at 400 to 500° C. to reduce the amount of contained hydrogen to 5% or less of the total number of atoms contained in the semiconductor film and then crystallization is performed, the surface of the film can be prevented from becoming rough. Generally, when the amorphous semiconductor film is formed by the sputtering method or the LPCVD method, the resulting film has a lower concentration of hydrogen than the amorphous semiconductor film formed by the plasma CVD method. However, even the amorphous semiconductor film formed by the plasma CVD method has a low concentration of hydrogen if formed at a temperature of 400° C. or higher.

In the laser crystallization method, the excimer laser, YAG laser, or YVO$_4$ laser of the pulse oscillation type or the continuous emission type can be employed. When using these lasers, it is efficient to converge laser beams radiated from the laser oscillator into the linear form by means of the optical system and then irradiate the converged beam onto the semiconductor film. Crystallization conditions should be selected by the operator as necessary. When using the excimer laser, the pulse oscillation frequency should be 300 Hz, and the laser energy density should be 100 to 800 mJ/cm$^2$, typically 200 to 700 mJ/cm$^2$. When using the YAG laser, the second harmonic emitted from the YAG laser is used. Then, the pulse oscillation frequency should be one to 300 Hz, and the laser energy density should be 300 to 1000 mJ/cm$^2$, typically 350 to 800 mJ/cm$^2$. Then, the laser beams that have been converged into the linear form with their width of 100 to 1000 μm, for example, 400 μm should be irradiated onto the entire substrate surface. Laser beam irradiation may also be performed with the 50–98% overlapping ratio of the beams that have been converged into the linear form.

Laser crystallization can be performed in the air, in the atmosphere of the inert gas such as nitrogen, or in the reduced pressure atmosphere.

Next, the second heat treatment by thermal annealing using the annealing furnace or the RTA method is carried out. (FIG. 20D) Thermal annealing using the annealing furnace should be performed for one to 30 minutes at a temperature higher than that in the first heat treatment. When the RTA method is used, the second heat treatment should be performed in the nitrogen atmosphere, for example, with 11 infrared halogen lamps 15 under the substrate and ten infrared halogen lamps 15 over the substrate turned on. In the RTA method, a momentary increase in temperature can be effected. However, temperature adjustment may also be performed during the heat treatment with a temperature rising rate or temperature lowering rage of 30 to 300° C. per minute. The heat supplied from the halogen lamps, which is measured by the thermocouple embedded in the silicon wafer, is in the temperature range of 700 to 1300° C. However, optimum heat treatment conditions differ, depending on the states of the substrate and the semiconductor film. Thus, the operator should determine the optimum heat treatment conditions as necessary.

In this embodiment mode, the heat treatment was carried out in the nitrogen atmosphere. However, the inert gas such as helium (He), neon (Ne), or argon (Ar) may also be employed. The halogen lamps were herein used as the light source. However, it is also preferable that the ultraviolet lamp such as the xenon lamp is employed as the light source.

This heat treatment causes the substrate to contract in a direction indicated by reference numeral 38. Thus, contraction of the semiconductor film 35 resulting from laser beam irradiation is lessened, so that the semiconductor film 39 is obtained.

Then, patterning is performed to form a semiconductor layer 40 of a desired shape. Thereafter, if TFTs are manufactured by using the semiconductor layer thus obtained, their electrical characteristics will become excellent.

A more detailed description of the present invention configured as described above will be given in the following description of embodiments below.

[Embodiment 1]

Embodiment 1 of the present invention will be described with reference to FIGS. 1A to 1D.

First, the base insulating film (not shown) is formed on the substrate 10. The glass substrate or the quartz substrate having transmissivity is employed as the substrate 10. As the base insulating film, the insulating film such as the silicon oxide film, silicon nitride film, or silicon oxynitride film is formed. The structure of the base insulating film is not limited to a single layer. Lamination of at least two layers of the insulating films may also be employed. Further, the base insulating film may not be formed. In this embodiment, the glass substrate is employed, and the silicon oxynitride film (not shown) having a film thickness of 150 nm is formed on the glass substrate by the plasma CVD method.

Next, the semiconductor film 11 is formed on the base insulating film. (FIG. 1A) The semiconductor film 11 is formed by depositing the amorphous semiconductor film using the well-known means such as the sputtering method, LPCVD method or plasma CVD method. The semiconductor film 11 is formed to have a thickness of 25 to 80 nm (preferably 30 to 60 nm). Any material can be used for the semiconductor film. However, preferably, silicon or the alloy of silicon and germanium (SiGe) is employed. In this embodiment, the amorphous silicon film having a film thickness of 55 nm is formed at a temperature of 400° C. by the plasma CVD method.

Then, the crystalline semiconductor film is formed by laser crystallization. (FIG. 1B) The crystalline semiconductor film 13 that has contracted under the tensile stress 12 by laser irradiation is formed. In this embodiment, the beams of the excimer laser are shaped by the optical system so as to produce the linear form on the irradiation plane, and laser beam irradiation is performed in the air. With this arrangement, crystallinity of the semiconductor film is improved. However, the crystalline semiconductor film 13 that has contracted by laser beam irradiation is formed.

Then, the heat treatment by thermal annealing using the annealing furnace or the RTA method is carried out. (FIG. 1C) In this embodiment, the RTA method is employed. The heat treatment is carried out for four minutes at a temperature of 700° C. in the nitrogen atmosphere, using halogen lamps.

This heat treatment causes the substrate to contract in the direction indicated by reference numeral 16. For this reason, contraction of the semiconductor film 13 resulting from laser beam irradiation is lessened, so that the semiconductor film 17 is obtained.

Then, patterning is performed to form the semiconductor layer 18 of a desired shape. If TFTs are then manufactured by using the semiconductor layer thus obtained, their electrical characteristics will become excellent.

[Embodiment 2]

In this embodiment, a method of reducing a warp in the semiconductor film through the manufacturing process different from the process according to Embodiment 1 will be described with reference to FIGS. 2A to 2D.

First, the state illustrated in FIG. 1A is obtained according to Embodiment 1. Incidentally, FIG. 1A is identical to FIG. 2A, so that like parts in both of the drawings are indicated by like reference numerals.

Then, the crystalline semiconductor film is formed by laser crystallization. (FIG. 2B) The crystalline semiconductor film 13 that has contracted under the tensile stress 12 by laser beam irradiation is formed. In this embodiment, the second harmonic emitted from the YAG laser is shaped by the optical system to produce the linear form on the irradiation plane, and laser beam irradiation is carried out in the nitrogen atmosphere. With this arrangement, crystallinity of the semiconductor film is improved. However, the semiconductor film 13 that has contracted due to laser beam irradiation is formed.

Figure 2A:
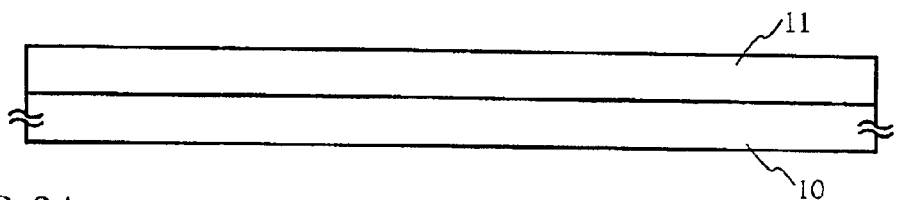
FIGS. 2A to 2D are cross-sectional views showing a concept of Embodiment 2.
Figure 2B:
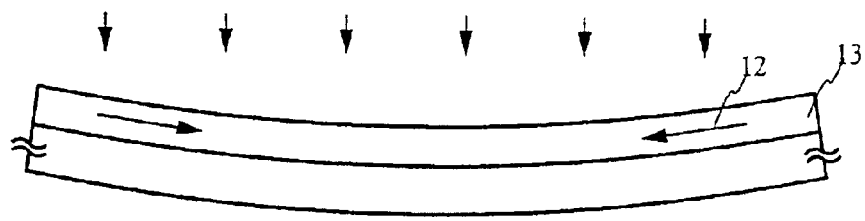
Figure 2C:
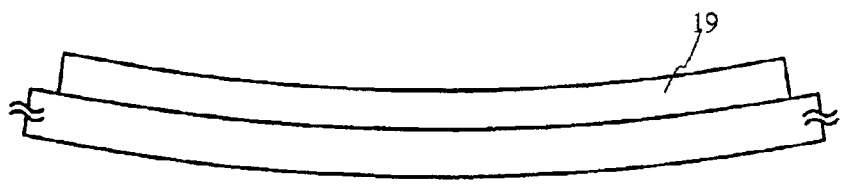
Figure 2D:
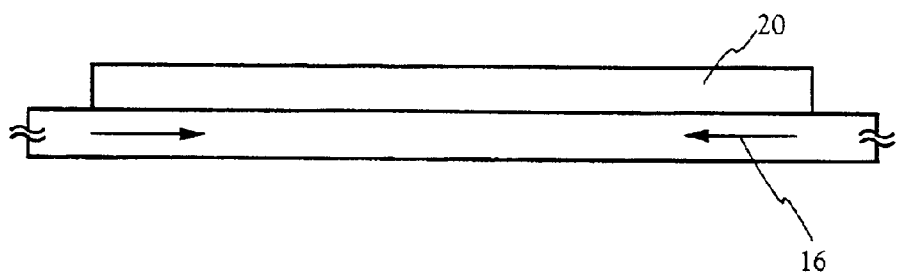

Then, patterning is performed to form a semiconductor layer 19. (FIG. 2C)

Next, the heat treatment by thermal annealing using the annealing furnace or the RTA method is carried out. (FIG. 2D) Thermal annealing using the annealing furnace should be performed for one to 30 minutes at 500° C. or higher, preferably in the range of 550 to 575° C. When using the RTA method as well, the heat treatment should be carried out for one to 30 minutes at 500° C. or higher. In this embodiment, thermal annealing using the annealing furnace is applied. The heat treatment for 30 minutes is therefore carried out at a temperature of 550° C. in the nitrogen atmosphere.

Since this heat treatment causes the substrate to contract in the direction indicated by reference numeral 16, contraction of the semiconductor film resulting from laser beam irradiation is lessened. Then, if TFTs are manufactured by using a semiconductor layer 20 obtained as the result of the heat treatment described above, their electrical characteristics will become excellent.

[Embodiment 3]

In this embodiment, a method of lessening a warp due to contraction of the semiconductor film by using the heat treatment through the manufacturing process different from the process according to Embodiments 1 and 2 will be described with reference to FIGS. 3A to 3D.

First, the glass substrate or the quartz substrate having transmissivity is employed as the substrate 10. In this embodiment, the glass substrate is used as the substrate 10.

Then, a conductive film is deposited over the substrate 10, and then etching is performed to form a conductive film 21 of a desired shape. Any material having heat resistance can be used for the conductive film. An element selected from the group consisting of Ta, W, Ti, Mo, Cu, Cr and Nd, may be used. Alternatively, an alloy material or a compound material mainly consisting of the element may also be used. Alternatively, a semiconductor film represented by a crystalline silicon film doped with an impurity element such as phosphorus may also be employed. Still alternatively, an alloy of Ag, Pd, and Cu (AgPdCu alloy) may also be employed. The structure of the conductive film is not limited to a single layer. Lamination of the layers of the conductive films may also be employed. In this embodiment, the conductive film 21 that comprises a W film having a thickness of 400 nm is formed.

Then, as an insulating film 22 formed on the conductive film 21, the insulating film such as the silicon oxide film, silicon nitride film, or silicon oxynitride film is formed. In this embodiment, the silicon oxide film having a thickness of 150 nm is formed by the plasma CVD method.

Figure 3A:
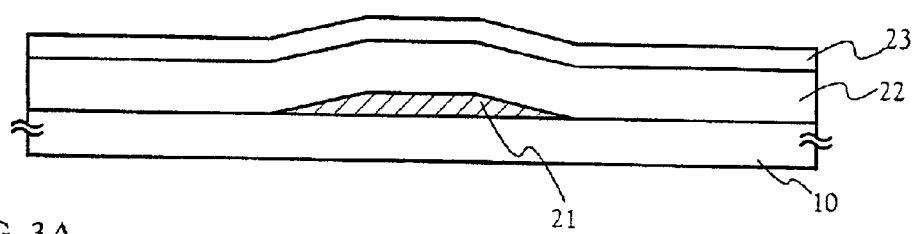
FIGS. 3A to 3D are cross-sectional views showing a concept of Embodiment 3.

A semiconductor film 23 is formed on the insulating film. The semiconductor film 23 is formed by depositing the amorphous semiconductor film using the well-known means such as the sputtering method, LPCVD method or plasma CVD method. The semiconductor film 23 is formed to have a thickness of 25 to 80 nm (preferably 30 to 60 nm). Any material can be used for the semiconductor film. However, preferably, silicon or the alloy of silicon and germanium (SiGe) is employed. In this embodiment, the amorphous silicon film having a film thickness of 55 nm is formed by the LPCVD method. (FIG. 3A)

Figure 3B:
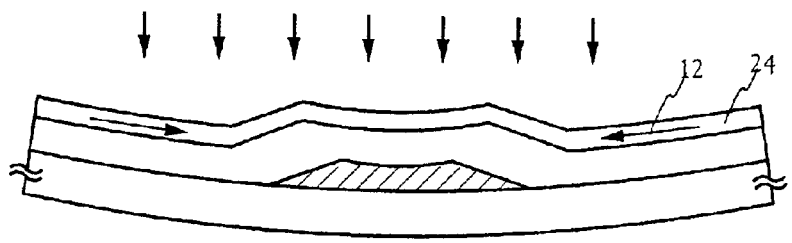

Then, crystallization of the semiconductor film is performed by laser crystallization. A crystalline semiconductor film 24 that has contracted under the tensile stress 12 by laser beam irradiation is formed. In this embodiment, the second harmonic emitted from the YAG laser is shaped by the optical system so as to produce the linear form on the irradiation plane, and laser beam irradiation is performed under vacuum. With this arrangement, crystallinity of the semiconductor film is improved. However, the crystalline semiconductor film 24 that has contracted by laser beam irradiation is formed. (FIG. 3B)

Figure 3C:
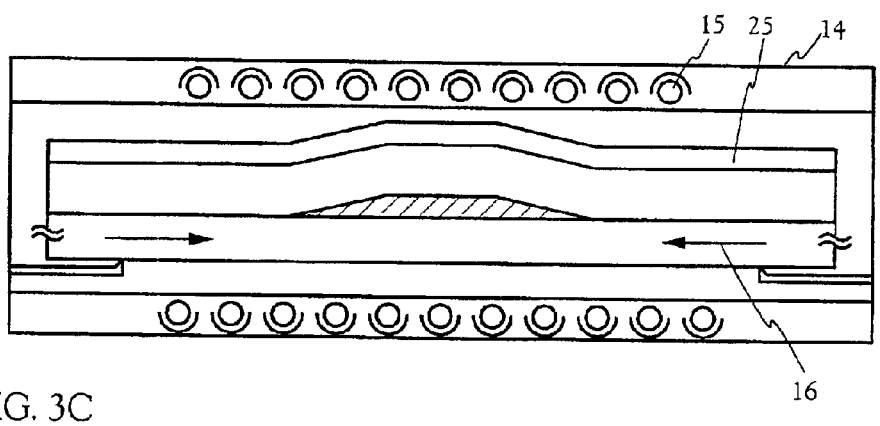
Figure 3D:
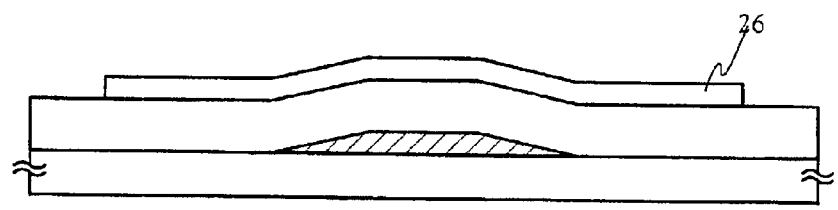

Then, the heat treatment is carried out. Thermal annealing using the annealing furnace or the RTA method may be applied for the heat treatment. When using the RTA method, the heat treatment is carried out in the nitrogen atmosphere, for example, with 11 infrared halogen lamps 15 provided under the substrate and ten infrared halogen lamps 15 provided over the substrate turned on. The heat supplied from the halogen lamps, which is measured by the thermocouple embedded in the silicon wafer, is at 700 to 1300° C. However, optimum heat treatment conditions differ, depending on the state of the semiconductor film. Thus, the operator should determine the optimum heat treatment conditions as necessary. In this embodiment, the heat treatment is carried out for five minutes at a temperature of 725° C. in the nitrogen atmosphere, using the RTA method. (FIG. 3C)

This heat treatment causes the substrate to contract in the direction indicated by reference numeral 16. For this reason, contraction of the semiconductor film 24 resulting from laser beam irradiation is lessened, so that the semiconductor film 25 is obtained.

Then, patterning is performed to form a semiconductor layer 26 of a desired shape. If TFTs are manufactured by using the semiconductor layer thus obtained, their electrical characteristics will become excellent.

[Embodiment 4]

Embodiment 4 of the present invention will be described with reference to FIGS. 20A to 20E.

First, the base insulating film (not shown) is formed on the substrate 30. The glass substrate or the quartz substrate having transmissivity is employed as the substrate 30. As the base insulating film, the insulating film such as the silicon oxide film, silicon nitride film, or silicon oxynitride film is formed. The structure of the base insulating film is not limited to a single layer. Lamination of at least two layers of the insulating films may also be employed. Further, the base insulating film may not be formed. In this embodiment, the glass substrate is employed, and the silicon oxynitride film (not shown) having a film thickness of 150 nm is formed over the glass substrate by the plasma CVD method.

Next, the semiconductor film 31 is formed on the base insulating film. (FIG. 20A) The semiconductor film 31 is formed by depositing the amorphous semiconductor film using the well-known means such as the sputtering method, LPCVD method or plasma CVD method. The semiconductor film 31 is formed to have a thickness of 25 to 80 nm (preferably 30 to 60 nm). Any material can be used for the semiconductor film. However, preferably, silicon or the alloy of silicon and germanium (SiGe) is employed. In this embodiment, the amorphous silicon film having a film thickness of 55 nm is formed at a temperature of 400° C. by the plasma CVD method.

Thereafter, the semiconductor film 31 is doped with a metal element for promoting crystallization by using the well-known means such as the sputtering method or the solution applying method to form the metal containing layer 32. As the metal element, one or a plurality of metal elements selected from the group consisting of Fe, Co, Ni, Ru, Rh, Pd, Os, Ir, Pt, Cu, Ag, Au, Sn and Sb are employed. In this embodiment, a solution that contains nickel is applied to the amorphous silicon film by a spin coating method.

Then, the first heat treatment is carried out to partially crystallize the semiconductor film to form the first crystalline semiconductor film 33. (FIG. 20B) Thermal annealing that uses the annealing furnace or the RTA method may be used for the first heat treatment. In this embodiment, the first heat treatment is carried out for four hours at a temperature of 550° C. in the nitrogen atmosphere, with the annealing furnace.

Then, the second crystalline semiconductor film 35 is formed by laser crystallization. (FIG. 20C) The second crystalline semiconductor film 35 that has contracted under the tensile stress 34 by laser irradiation is formed. In this embodiment, the excimer laser beam is shaped by the optical system so as to produce the linear form on the irradiation plane, and laser beam irradiation is performed in the air. With this arrangement, crystallinity of the semiconductor film is improved. However, the second crystalline semiconductor film 35 that has contracted by laser beam irradiation is formed.

Then, the second heat treatment by thermal annealing that uses the annealing furnace or the RTA method is carried out. (FIG. 20D) In this embodiment, the RTA method is employed. The second heat treatment is carried out for five minutes at a temperature of 750° C. in the nitrogen atmosphere, with halogen lamps.

This heat treatment causes the substrate to contract in the direction indicated by reference numeral 38. For this reason, contraction of the semiconductor film 38 resulting from laser beam irradiation is lessened, so that the semiconductor film 39 is obtained.

Then, patterning is performed to form the semiconductor layer 40 of a desired shape. If TFTs are manufactured by using the semiconductor layer thus obtained, their electrical characteristics will become excellent.

[Embodiment 5]

In this embodiment, a method of reducing a warp in the semiconductor film through the manufacturing process different from the process according to Embodiment 4 will be described with reference to FIGS. 21A to 21D.

Figure 20A:
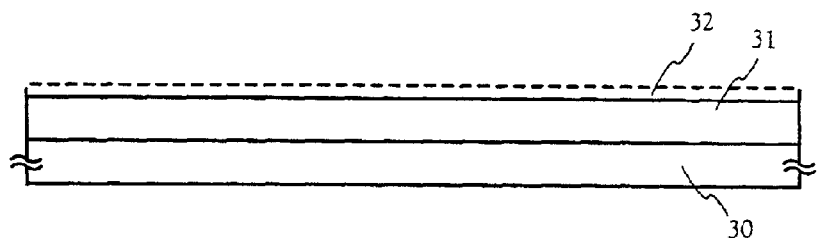
FIGS. 20A to 20E are cross-sectional views showing a concept of Embodiment 4.
Figure 20B:
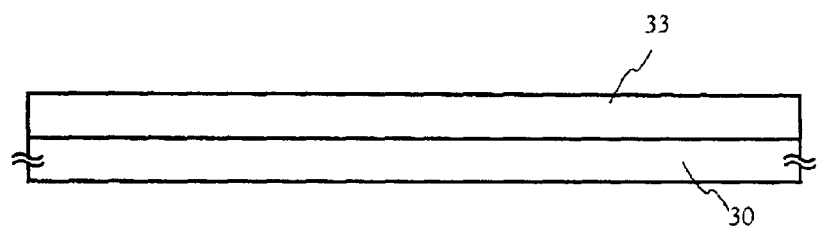
Figure 20C:
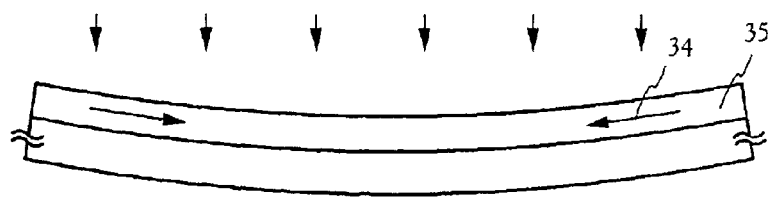
Figure 20D:
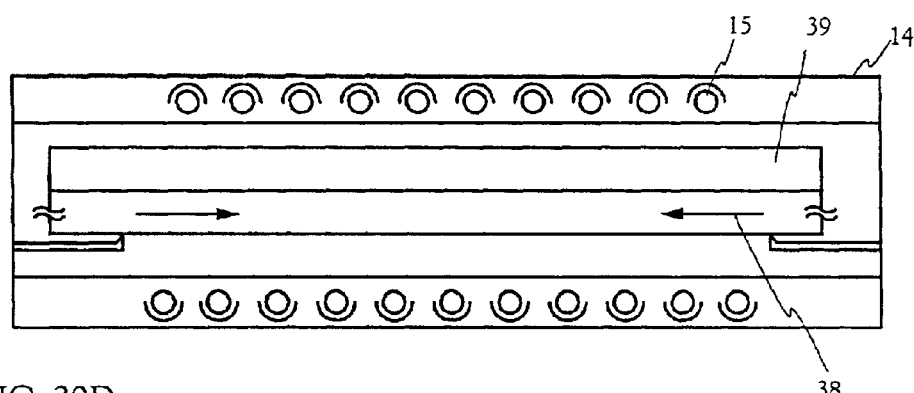
Figure 20E:
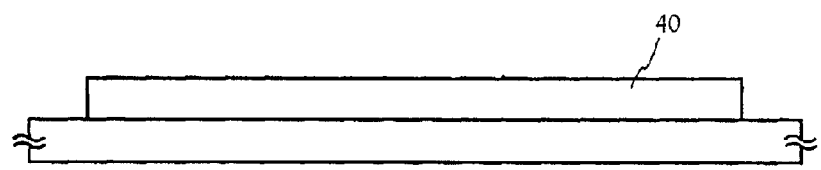
Figure 21A:
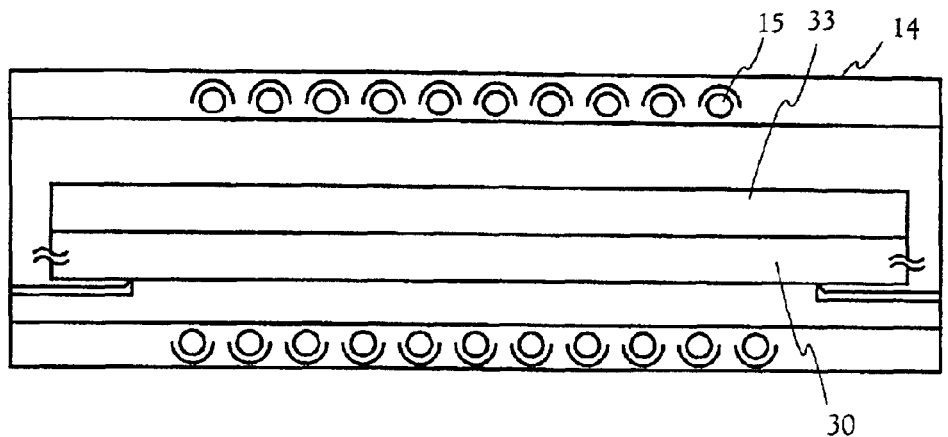
FIGS. 21A to 21D are cross-sectional views showing a concept of Embodiment 5.
Figure 21B:
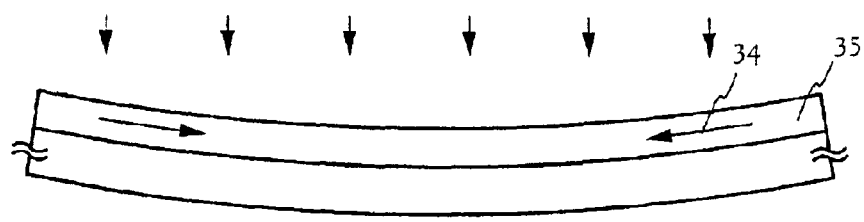
Figure 21C:
Figure 21D:
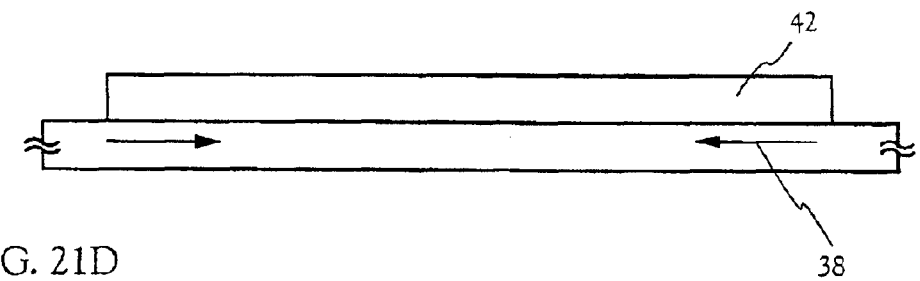
Figure 22A:
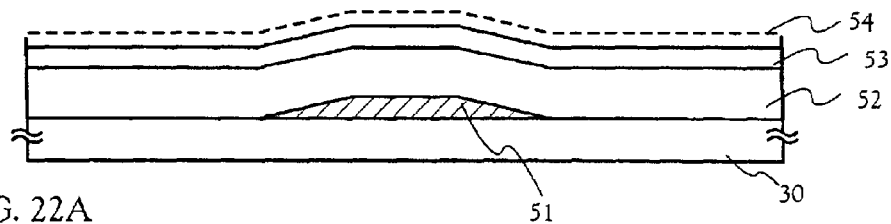
FIGS. 22A to 22E are cross-sectional views showing a concept of Embodiment 6.
Figure 22B:
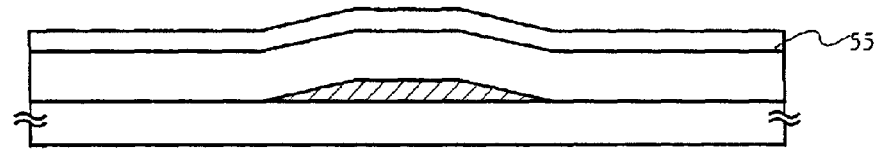
Figure 22C:
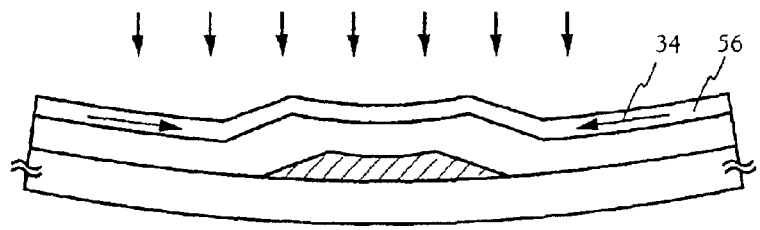
Figure 22D:
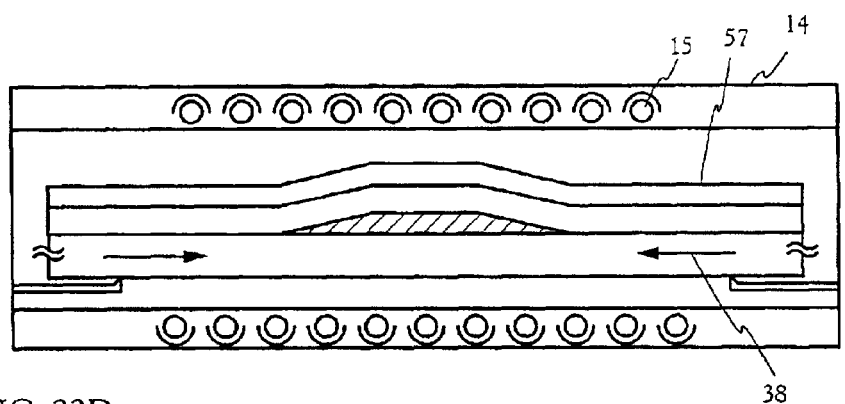
Figure 22E:
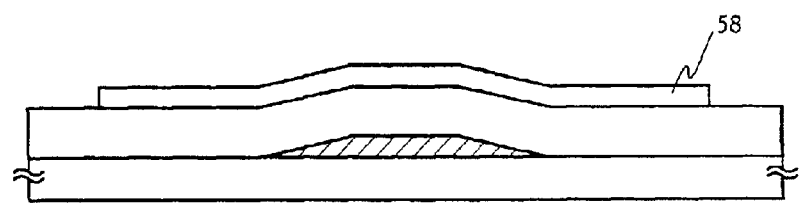

First, the state illustrated in FIG. 20A is obtained according to Embodiment 4.

Then, the first heat treatment is carried out to partially crystallize the semiconductor film to form the first crystalline semiconductor film 33. (FIG. 20B) Thermal annealing that uses the annealing furnace or the RTA method may be used for the first heat treatment. In this embodiment, the first heat treatment is carried out for 100 seconds at a temperature of 700° C. in the nitrogen atmosphere, using the RTA method.

Then, the crystalline semiconductor film 35 is formed by laser crystallization. In this embodiment, the second harmonic emitted from the YAG laser is shaped by the optical system so as to produce the linear form on the irradiation plane, and laser beam irradiation is performed in the nitrogen atmosphere. With this arrangement, crystallinity of the semiconductor film is improved. However, the second crystalline semiconductor film 35 that has contracted by laser beam irradiation is formed.

Then, patterning is performed to form a semiconductor layer 41.

Thereafter, the second heat treatment by thermal annealing using the annealing furnace or the RTA method is carried out. The second heat treatment is carried out at a temperature higher than that for the first heat treatment. In this embodiment, thermal annealing using the annealing furnace is applied. The second heat treatment is carried out for 30 minutes at a temperature of 600° C. in the nitrogen atmosphere.

This heat treatment causes the substrate to contract in the direction indicated by reference numeral 38. For this reason, contraction of the semiconductor layer 39 resulting from laser beam irradiation is lessened, so that the semiconductor film 42 is obtained. If TFTs are manufactured by using the semiconductor layer 42 thus obtained, their electrical characteristics will become excellent.

[Embodiment 6]

In this embodiment, a method of reducing a warp in the semiconductor film by using the heat treatment through the manufacturing process different from the process according to Embodiment 4 or 5 will be described with reference to FIGS. 22A to 22E.

First, the glass substrate or the quartz substrate having transmissivity is employed as the substrate 30. In this embodiment, the glass substrate is used as the substrate 30.

Then, the conductive film is formed on the substrate 30, and then etching is performed to form a conductive film 51 of a desired shape. Any material having heat resistance can be used for the conductive film. An element selected from the group consisting of Ta, W, Ti, Mo, Cu, Cr and Nd, may be used. Alternatively, the alloy material or the compound material mainly consisting of the selected element may also be used. Alternatively, the semiconductor film represented by the crystalline silicon film doped with the impurity element such as phosphorus may also be employed. Still alternatively, the alloy of Ag, Pd, and Cu (AgPdCu alloy) may also be employed. The structure of the conductive film is not limited to a single layer. Lamination of the layers of the conductive films may also be employed. In this embodiment, the conductive film 51 that comprises the W film having a thickness of 400 nm is formed.

Then, as an insulating film 52 formed on the conductive film 51, the insulating film such as the silicon oxide film, silicon nitride film, or silicon oxynitride film is formed. In this embodiment, the silicon oxide film having a thickness of 150 nm is formed by the plasma CVD method.

A semiconductor film 53 is formed on the insulating film. The semiconductor film 53 is formed by depositing the amorphous semiconductor film using the well-known means such as the sputtering method, LPCVD method or plasma CVD method. The semiconductor film 53 is formed to have a thickness of 25 to 80 nm (preferably 30 to 60 nm). Any material can be used for the semiconductor film 53. However, preferably, silicon or the alloy of silicon and germanium (SiGe) is employed. In this embodiment, the amorphous silicon film having a film thickness of 55 nm is formed by the plasma CVD method.

Thereafter, the semiconductor film 53 is doped with a metal element for promoting crystallization by using the well-known means such as the sputtering method or the solution applying method to form a metal containing layer 54. (FIG. 22A) As the metal element, one or a plurality of the metal elements selected from the group consisting of Fe, Co, Ni, Ru, Rh, Pd, Os, Ir, Pt, Cu, Ag, Au, Sn and Sb are employed. In this embodiment, the metal containing layer 54 containing nickel is formed by the sputtering method.

Then, the first heat treatment is carried out to partially crystallize the semiconductor film to form a first crystalline semiconductor film 55. (FIG. 22B) Thermal annealing that uses the annealing furnace or the RTA method may be used for the heat treatment. In this embodiment, the first heat treatment is carried out for four hours at a temperature of 550° C. in the nitrogen atmosphere, with the annealing furnace.

Then, a second crystalline semiconductor film 56 is formed by laser crystallization. (FIG. 22C) The crystalline semiconductor film 56 that has contracted under the tensile stress 34 is formed by laser irradiation. In this embodiment, the excimer laser beam is shaped by the optical system so as to produce the linear form on the irradiation plane, and laser beam irradiation is performed in the air. With this arrangement, crystallinity of the semiconductor film is improved. However, the crystalline semiconductor film 56 that has contracted by laser beam irradiation is formed.

Then, the second heat treatment by thermal annealing using the annealing furnace or the RTA method is carried out. (FIG. 22D) In this embodiment, the RTA method is applied. The second heat treatment is carried out for four minutes at a temperature of 700° C. in the nitrogen atmosphere, with halogen lamps. The warp in the semiconductor film 57 that has undergone these heat treatment processes is reduced, compared with the time after laser crystallization is performed.

Then, patterning is performed to form a semiconductor layer 58 of a desired shape. If TFTs are manufactured by using the semiconductor layer thus obtained, their electrical characteristics will become excellent.

[Embodiment 7]

In this embodiment, the manufacturing method of the active matrix substrate is explained using FIGS. 4A to 8. In this specification, the substrate on which both the driver circuit and the pixel portion are formed is referred to as an active matrix substrate for convenience' sake.

First, in this embodiment, a substrate 320 is used, which is made of glass such as barium borosilicate glass or aluminum borosilicate, represented by such as Corning #7059 glass and #1737 glass. Note that, as the substrate 320, a quartz substrate, a silicon substrate, a metallic substrate or a stainless substrate on which is formed an insulating film. A plastic substrate with heat resistance to a process temperature of this embodiment may also be used.

Then, a base film 321 formed of an insulating film such as a silicon oxide film, a silicon nitride film or a silicon oxynitride film is formed on the substrate 320. In this embodiment, a two-layer structure is used as the base film 321. However, a single-layer film or a lamination structure consisting of two or more layers of the insulating film may be used. As a first layer of the base film 321, a silicon oxynitride film 321$a$ is formed with a thickness of 10 to 200 nm (preferably 50 to 100 nm) with a plasma CVD method using SiH$_4$, NH$_3$, and N$_2$O as reaction gas. In this embodiment, the silicon oxynitride film 321$a$ (composition ratio Si=32%, O=27%, N=24% and H=17%) with a film thickness of 50 nm is formed. Then, as a second layer of the base film 321, a silicon oxynitride film 321$b$ is formed and laminated into a thickness of 50 to 200 nm (preferably 100 to 150 nm) with a plasma CVD method using SiH$_4$ and N$_2$O as reaction gas. In this embodiment, the silicon oxynitride film 321$b$ (composition ratio Si=32%, O=59%, N=7% and H=2%) with a film thickness of 100 nm is formed.

Subsequently, semiconductor film 322 is formed on the base film. The semiconductor film 322 is formed from a semiconductor film with an amorphous structure which is formed by a known method (such as a sputtering method, an LPCVD method, or a plasma CVD method) into the thickness of from 25 to 80 nm (preferably 30 to 60 nm). The material of the crystalline semiconductor film is not particularly limited, but it is preferable to be formed of silicon, a silicon germanium (SiGe) alloy, or the like. The semiconductor film 322 is crystallized next. The laser crystallization is applied to crystallization of the semiconductor film. Further, other than laser crystallization, known thermal crystallization using metal elements such as nickel as a catalyst are applicable for a crystallization of the semiconductor film. Especially, the combination of the thermal crystallization using metal elements such as nickel and the laser crystallization method is preferable to use because the electron field-effect mobility of manufacturing an n-channel TFT is improved considerably to 500 to 600 Vs/cm$^2$. The electron field-effect mobility is about 200 Vs/cm$^2$ when the laser crystallization is only used.

Pulse oscillation or continuous light emission lasers such as excimer lasers, YAG laser, and YVO$_4$ laser can be used in the laser crystallization method. A method in which a laser beam emitted from a laser oscillator is concentrated into a linear shape by an optical system and then irradiated to the semiconductor film may be used for cases in which the above lasers are used. The crystallization conditions may be suitably selected by an operator, but the pulse oscillation frequency is set to 300 Hz, and the laser energy density is set between 100 and 800 mJ/cm$^2$ (typically from 200 to 700 mJ/cm$^2$) when an excimer laser is used. Further, the second harmonic is used if a YAG laser is employed, the pulse oscillation frequency may be set from 1 to 300 Hz, and the laser energy density may be set between 300 and 1000 mJ/cm$^2$ (typically from 350 to 800 mJ/cm$^2$). The laser beam concentrated into a linear shape having a width of 100 to 1000 μm, for example 400 μm, is then irradiated over the entire surface of the substrate. Irradiation may be performed at this point with an overlap ratio for the linear shape beam set between 50 and 98%.

Figure 4A:
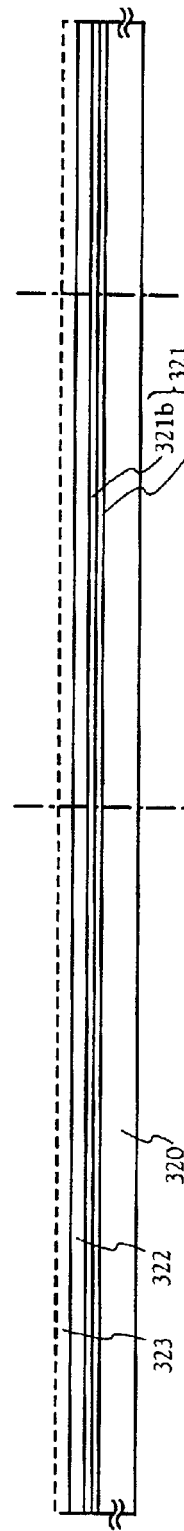
FIGS. 4A to 4D are cross-sectional views showing a process of manufacturing pixel TFTs and driver circuit TFTs of Embodiment 7.
Figure 4B:
Figure 4C:

In this embodiment, the metal containing layer 323 is formed by applying nickel using a solution application method (FIG. 4A). As a first heat treatment, the metal containing layer 323 is exposed in nitrogen atmosphere at 575° C. for 4 hours to obtain a semiconductor film 324 (FIG. 4B). The second harmonic of the YAG laser is made into linear shape by an optical system on the irradiation surface and irradiated in the nitrogen atmosphere to obtain a semiconductor film 325 (FIG. 4C). Therefore, though the crystallization of the semiconductor film is improved, a shrunk semiconductor film 325 is formed by irradiating the laser light.

Figure 4D:
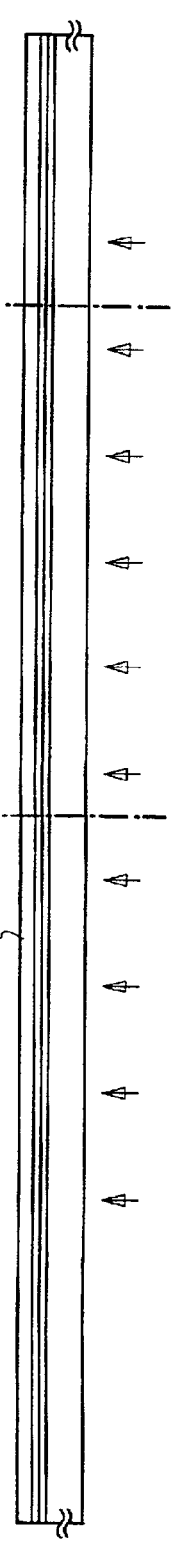

To decrease the distortion formed by irradiating the laser light, the second heat treatment is conducted (FIG. 4D). In this embodiment, the semiconductor film 325 is exposed in the nitrogen atmosphere at 700° C. for five minutes using halogen lamp. The distortion of the semiconductor film 326 by which such heat treatment is conducted is decreased compared with after the laser crystallization.

Thus formed the crystalline semiconductor film is patterned into the desired shape to form the semiconductor layers 402 to 406.

Further, after the formation of the semiconductor layer 402 to 406, a minute amount of impurity element (boron or phosphorus) may be doped to control a threshold value of the TFT.

A gate insulating film 407 is then formed for covering the semiconductor layers 402 to 406. The gate insulating film 407 is formed of an insulating film containing silicon by a plasma CVD method or a sputtering method into a film thickness of from 40 to 150 nm. In this embodiment, the gate insulating film 407 is formed of a silicon oxynitride film into a thickness of 110 nm by a plasma CVD method (composition ratio Si=32%, O=59%, N=7%, and H=2%). Of course, the gate insulating film is not limited to the silicon oxynitride film, and an other insulating film containing silicon may be used as a single layer or a lamination structure.

Besides, when the silicon oxide film is used, it can be possible to be formed by a plasma CVD method in which TEOS (tetraethyl orthosilicate) and O$_2$ are mixed and discharged at a high frequency (13.56 MHz) power density of 0.5 to 0.8 W/cm$^2$ with a reaction pressure of 40 Pa and a substrate temperature of 300 to 400° C. Good characteristics as the gate insulating film can be obtained in the manufactured silicon oxide film thus by subsequent thermal annealing at 400 to 500° C.

Then, as shown in FIG. 5A, on the gate insulating film 407, a first conductive film 408 with a thickness of 20 to 100 nm and a second conductive film 409 with a thickness of 100 to 400 nm are formed and laminated. In this embodiment, the first conductive film 408 of TaN film with a film thickness of 30 nm and the second conductive film 409 of a W film with a film thickness of 370 nm are formed into lamination. The TaN film is formed by sputtering with a Ta target under a nitrogen containing atmosphere. Besides, the W film is formed by the sputtering method with a W target. The W film may be formed by a thermal CVD method using tungsten hexafluoride (WF$_6$). Whichever method is used, it is necessary to make the material have low resistance for use as the gate electrode, and it is preferred that the resistivity of the W film is set to less than or equal to 20 μΩcm. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film by a sputtering method using a W target with a high purity of 99.9999% and in addition, by taking sufficient consideration to prevent impurities within the gas phase from mixing therein during the film formation, a resistivity of from 9 to 20 μΩcm can be realized.

Note that, in this embodiment, the first conductive film 408 is made of TaN, and the second conductive film 409 is made of W, but the material is not particularly limited thereto, and either film may be formed of an element selected from the group consisting of Ta, W, Ti, Mo, Al, Cu, Cr, and Nd, or an alloy material or a compound material containing the above element as its main constituent. Besides, a semiconductor film, typified by a crystalline silicon film doped with an impurity element such as phosphorus, may be used. Further, an AgPdCu alloy may be used. Besides, any combination may be employed such as a combination in which the first conductive film is formed of tantalum (Ta) and the second conductive film is formed of W, a combination in which the first conductive film is formed of titanium nitride (TiN) and the second conductive film is formed of W, a combination in which the first conductive film is formed of tantalum nitride (TaN) and the second conductive film is formed of Al, or a combination in which the first conductive film is formed of tantalum nitride (TaN) and the second conductive film is formed of Cu.

Next, masks 410 to 415 made of resist are formed using a photolithography method, and a first etching process is performed in order to form electrodes and wirings. This first etching process is performed with the first and second etching conditions. In this embodiment, as the first etching conditions, an ICP (inductively coupled plasma) etching method is used, a gas mixture of $CF_4$, $Cl_2$ and $O_2$ is used as an etching gas, the gas flow rate is set to 25/25/10 sccm, and plasma is generated by applying a 500 W RF (13.56 MHz) power to a coil shape electrode under 1 Pa. A dry etching device with ICP (Model E645-ICP) produced by Matsushita Electric Industrial Co. Ltd. is used here. A 150 W RF (13.56 MHz) power is also applied to the substrate side (test piece stage) to effectively apply a negative self-bias voltage. The W film is etched with the first etching conditions, and the end portion of the first conductive layer is formed into a tapered shape.

Thereafter, the first etching conditions are changed into the second etching conditions without removing the masks 410 to 415 made of resist, a mixed gas of $CF_4$ and $Cl_2$ is used as an etching gas, the gas flow rate is set to 30/30 sccm, and plasma is generated by applying a 500 W RF (13.56 MHz) power to a coil shape electrode under 1 Pa to thereby perform etching for about 30 seconds. A 20 W RF (13.56 MHz) power is also applied to the substrate side (test piece stage) to effectively a negative self-bias voltage. The W film and the TaN film are both etched on the same order with the second etching conditions in which $CF_4$ and $Cl_2$ are mixed. Note that, the etching time may be increased by approximately 10 to 20% in order to perform etching without any residue on the gate insulating film.

In the first etching process, the end portions of the first and second conductive layers are formed to have a tapered shape due to the effect of the bias voltage applied to the substrate side by adopting masks of resist with a suitable shape. The angle of the tapered portions may be set to 15° to 45°. Thus, first shape conductive layers 417 to 422 (first conductive layers 417a to 422a and second conductive layers 417b to 422b) constituted of the first conductive layers and the second conductive layers are formed by the first etching process. Reference numeral 416 denotes a gate insulating film, and regions of the gate insulating film which are not covered by the first shape conductive layers 417 to 422 are made thinner by approximately 20 to 50 nm by etching.

Then, a first doping process is performed to the semiconductor layer without removing the mask made of resist (FIG. 5B). Doping may be carried out by an ion doping method or an ion implantation method. The condition of the ion doping method is that a dosage is $1\times10^{13}$ to $5\times10^{15}$ atoms/cm², and an acceleration voltage is 60 to 100 keV. In this embodiment, the dosage is $1.5\times10^{15}$ atoms/cm² and the acceleration voltage is 80 keV. As the impurity element for imparting the n-type conductivity, an element which belongs to group 15 of the periodic table, typically phosphorus (P) or arsenic (As) is used, and phosphorus is used here. In this case, the conductive layers 417 to 421 become masks to the impurity element for imparting the n-type conductivity, and high concentration impurity regions 306 to 310 are formed in a self-aligning manner. The impurity element for imparting the n-type conductivity is added to the high concentration impurity regions 306 to 310 in the concentration range of $1\times10^{20}$ to $1\times10^{21}$ atoms/cm³.

Thereafter, a second etching process is preformed without removing the masks made of resist. A mixed gas of $CF_4$, $Cl_2$ and $O_2$ may be used as etching gas used and the W film is selectively etched. The second conductive layers 428b to 433b are formed by a second etching process. On the other hand, the first conductive layers 417a to 422a are hardly etched (428a–433a), and the second conductive layers 428 to 433 are formed.

Next, a second doping process is performed as shown in FIG. 6A without removing the masks from resists. The impurity elements which imparts n-type conductivity is doped under the condition that the dose amount is lower than that of a first doping process with an acceleration voltage 70 to 120 keV. In this embodiment, the dosage is $1.5\times10^{14}$ atoms/cm², and the acceleration voltage is 90 keV. The second doping process is using a second shaped conductive layers 428 to 433 as masks, and the impurity elements is doped with a semiconductor layer at the below of the second conductive layers 428b to 433b. Second high concentration impurity regions 423a to 427a and low concentration impurity region 423b to 427b are newly formed.

Next, after the masks are removed, masks 434a and 434b form resists are newly formed, and the third etching process is performed as shown in FIG. 6B. A mixed gas of $SF_6$ and $Cl_2$ is used as an etching gas, the gas flow rate is set to 50/10 sccm, and plasma is generated by applying a 500 W RF (13.56 MHz) power to a coil shape electrode under 1.3 Pa to thereby perform etching for about 30 seconds. A 10 W RF (13.56 MHz) power is also applied to the substrate side (test piece stage) to effectively applied to a negative self-bias voltage. Thus, the third shape conductive layers 435 to 438 (435a to 438a and 435b to 438b) of the p-channel type TFT and the TFT of the pixel portion (pixel TFT) are formed by etching the TaN film in above-mentioned third etching process.

Next, after removing the masks from resists, the insulating layers 439 to 444 is formed by removing selectively the gate insulating film 416 and using the second shape conductive layer 428 and 430, and the second shape conductive layers 435 to 438 as a mask (FIG. 6C).

Figure 7A:
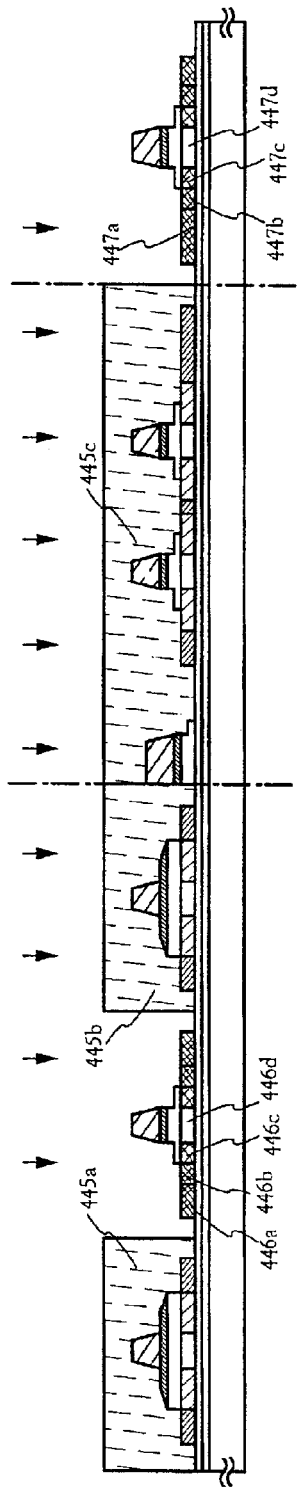
FIGS. 7A to 7C are cross-sectional views showing the process of manufacturing pixel TFT and driver circuit TFTs of Embodiment 7.

Successively, there is carried out a third doping processing by newly forming masks 445a to 445c comprising resists. By the third doping processing, there are formed impurity regions 446 and 447 added with an impurity element for providing a conductive type reverse to the above-described one conductive type at semiconductor layers constituting activation layers of p-channel type TFTs. The impurity regions are formed self-adjustingly by adding the impurity element providing p-type by using the second conductive layers 435a and 438a as masks against the impurity element. In this embodiment, the impurity regions 446 (including 446a to 446c) and 447 (including 447a to 447c) are formed by an ion doping process using diborane ($B_2H_6$) (FIG. 7A). In the third doping processing, the semiconductor layers forming n-channel type TFTs are covered by the masks 445a to 445c comprising resists. Although the impurity regions 446 and 447 are added with phosphorus at concentrations different from each other by the first doping processing and the second doping process, in any of the regions, by carrying out the doping processing such that the concentration of the impurity element for providing p-type falls in a range of $2\times10^{20}$ through $2\times10^{21}$ atoms/cm³, the impurity regions function as source regions and drain regions of p-channel type TFTs and accordingly, no problem is posed. In this embodiment, portions of the semiconductor layers constituting activation layers of p-channel type TFTs are exposed and accordingly, there is achieved an advantage that the impurity element (boron) is easy to add thereto.

The impurity regions are formed at the respective semiconductor layers by the above-described steps.

Next, a first interlayer insulating film 461 is formed by removing the masks 445a to 445c comprising resists. The first interlayer insulating film 461 is formed by an insulating film including silicon and having a thickness of 100 through 200 nm by using a plasma CVD process or a sputtering process. In this embodiment, a silicon oxynitride film having a film thickness of 150 nm is formed by a plasma CVD process. Naturally, the first interlayer insulating film 461 is not limited to the silicon oxynitride film but other insulating film including silicon may be used as a single layer or a laminated structure.

Figure 7B:
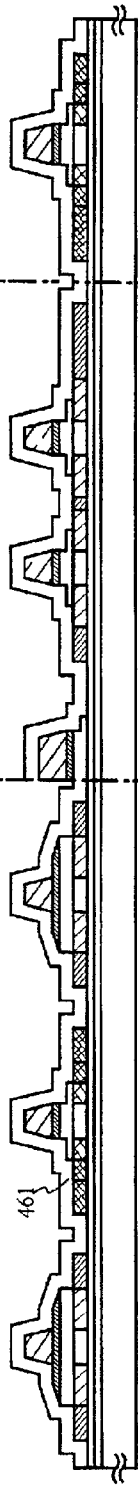

Next, as shown by FIG. 7B, there is carried out a step of activating the impurity elements added to the respective semiconductor layers. The activating step is carried out by a thermal annealing process using a furnace annealing furnace, a RTA process, a laser annealing process and the like. The thermal annealing process may be carried out in a nitrogen atmosphere having an oxygen concentration equal to or smaller than 1 ppm, preferably, equal to or smaller than 0.1 ppm at 400 through 700° C., representatively, 500 through 550° C. As a laser annealing method, the second harmonic of YAG laser and the like can be used. In this embodiment, the activation processing is carried out by a heat treatment at 550° C. for 4 hours.

Further, the heat treatment may be carried out prior to forming the first interlayer insulating film. However, when a wiring material used is weak at heat, it is preferable to carry out the heat treatment after forming the interlayer insulating film (insulating film whose major component is silicon, for example, silicon nitride film) for protecting wirings as in this embodiment.

Further, there is carried out a step of hydrogenating the semiconductor layer by carrying out a heat treatment at 300 to 550° C. for 1 through 12 hours. The step is a step of terminating dangling bond of the semiconductor layer by hydrogen included in the first interlayer insulating film 461. The semiconductor layer can be hydrogenated irrespective of existence of the first interlayer insulating film. As other means of hydrogenation, there may be carried out plasma hydrogenation (using hydrogen excited by plasma), and a heat treatment in an atmosphere including 3 to 100% of hydrogen at 300 to 450° C. for 1 through 12 hours.

Next, there is formed a second interlayer insulating film 462 comprising an inorganic insulating material or an organic insulating material on the first interlayer insulating film 461. In this embodiment, there is formed a acrylic resin film having film thickness of 1.6 µm and there is used a film having a viscosity of 10 to 1000 cp, preferably, 40 through 200 cp and formed with projections and recesses at a surface thereof.

In this embodiment, in order to prevent the mirror reflection, projection and recess portions are formed on the surfaces of the pixel electrodes by forming the second interlayer insulating film with projection and recess portions on the surface. Also, in order to attain light scattering characteristics by forming the projection and recess portions on the surfaces of the pixel electrodes, projection portions may be formed in regions below the pixel electrodes. In this case, since the same photomask is used in the formation of the TFTs, the projection portions can be formed without increasing the number of processes. Note that the projection portion may be suitably provided in the pixel portion region except for the wirings and the TFT portion over the substrate. Thus, the projection and recess portions are formed on the surfaces of the pixel electrodes along the projection and recess portions formed on the surface of the insulating film covering the projection portion.

Also, a film with the leveled surface may be used as the second interlayer insulating film 462. In this case, after the formation of the pixel electrodes, projection and recess portions are formed on the surface with a process using a known method such as a sandblast method or an etching method. Thus, since the mirror reflection is prevented and reflection light is scattered, whiteness is preferably increased.

Then, in a driver circuit 506, wirings 463 to 467 electrically connected with the respective impurity regions are formed. Note that those wirings are formed by patterning a lamination film of a Ti film with a film thickness of 50 nm and an alloy film (alloy film of Al and Ti) with a film thickness of 500 nm. Needless to say, the single structure or triple or more structure can be used without the limitation of the double structure. The material of wiring is not limited to the Al and Ti. For example, wirings can be formed by patterning the laminated film composed of Al, Cu and further Ti film are formed on TaN film.

Figure 7C:
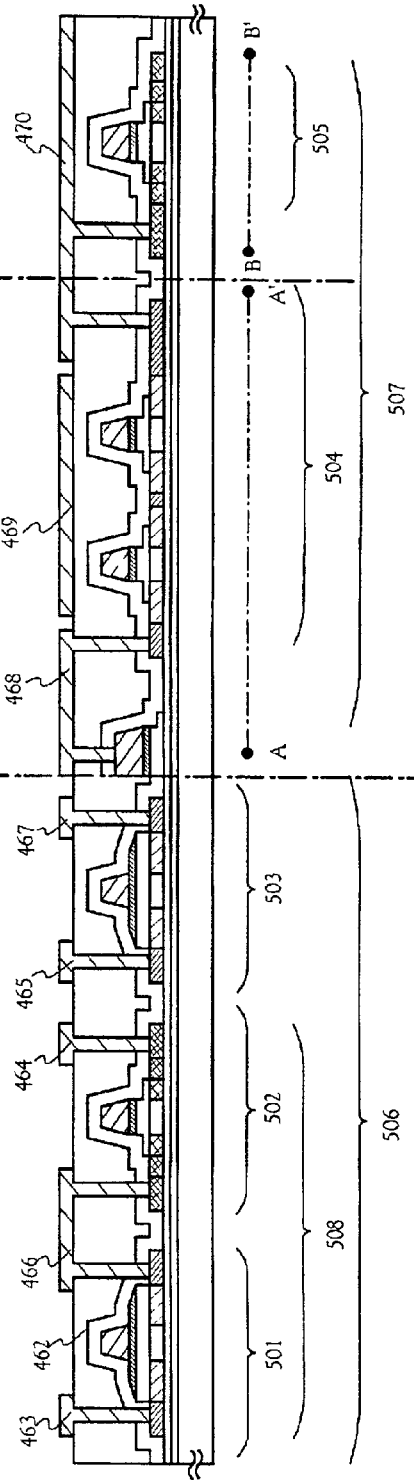

Also, in a pixel portion 507, a pixel electrode 470, a gate wiring 469, and a connection electrode 468 are formed (FIG. 7C). By this connection electrode 468, an electrical connection between a source wiring 436 (lamination layer of the impurity region 436a and the first conductive layer 436b) and the pixel TFT 504 is formed. Also, an electrical connection between the gate wiring 469 and the gate electrode of the pixel TFT is formed. With respect to the pixel electrode 470, an electrical connection with the drain region 426a of the pixel TFT 504 and an electrical connection with the semiconductor layer 406 which functions as one of electrodes for forming a storage capacitor are formed. It is desired that a material having a high reflectivity, such as a film containing Al or Ag as its main constituent, or a lamination film thereof, is used for the pixel electrode 470.

Thus, the driver circuit 506 having a CMOS circuit 508 formed by an n-channel TFT 501 and a p-channel TFT 502 and an n-channel type TFT 503, and the pixel portion 507 having a pixel TFT 504 and a storage capacitor 505 can be formed over the same substrate. As a result, the active matrix substrate is completed.

The n-channel type TFT 501 of the driver circuit 506 has a channel forming region 423c, a low concentration impurity region (GOLD region) 423b overlapping with the first conductive layer 428a constituting a portion of the gate electrode, and a high concentration impurity region 423a which functions as the source region or the drain region. The p-channel type TFT 502 forming the CMOS circuit by connecting with the n-channel type TFT 501 through an electrode 466 has a channel forming region 446d, an impurity region 446b and 446c formed outside the gate electrode, and a high concentration impurity region 446a which function as the source region or the drain region. The n-channel type TFT 503 has a channel forming region 425c, a low concentration impurity region 425b (GOLD region) overlapping with the first conductive layer 430a comprising a part of the gate electrode, and a high concentration impurity region 425a which functions as the source region or the drain region.

The pixel TFT 504 of the pixel portion 507 includes a channel forming region 426c, a low concentration impurity region 426b (LDD region) formed outside the gate electrode, and the high concentration impurity region 426a functioning as a source region or a drain region. Besides, impurity elements imparting p-type conductivity are added to the respective semiconductor layers 447a and 447b functioning as one of the electrodes of the storage capacitor 505. The semiconductor layer 447 is not added with the impurity element. The storage capacitor 505 is formed from the electrode 438 (a lamination of 438a and 438b) and the semiconductor layers 447a to 447c using the insulating film 444 as a dielectric member.

Further, in the pixel structure of this embodiment, an end portion of the pixel electrode is formed by arranging it so as to overlap with the source wiring so that the gap between the pixel electrodes is shielded from light without using a black matrix.

Figure 8:
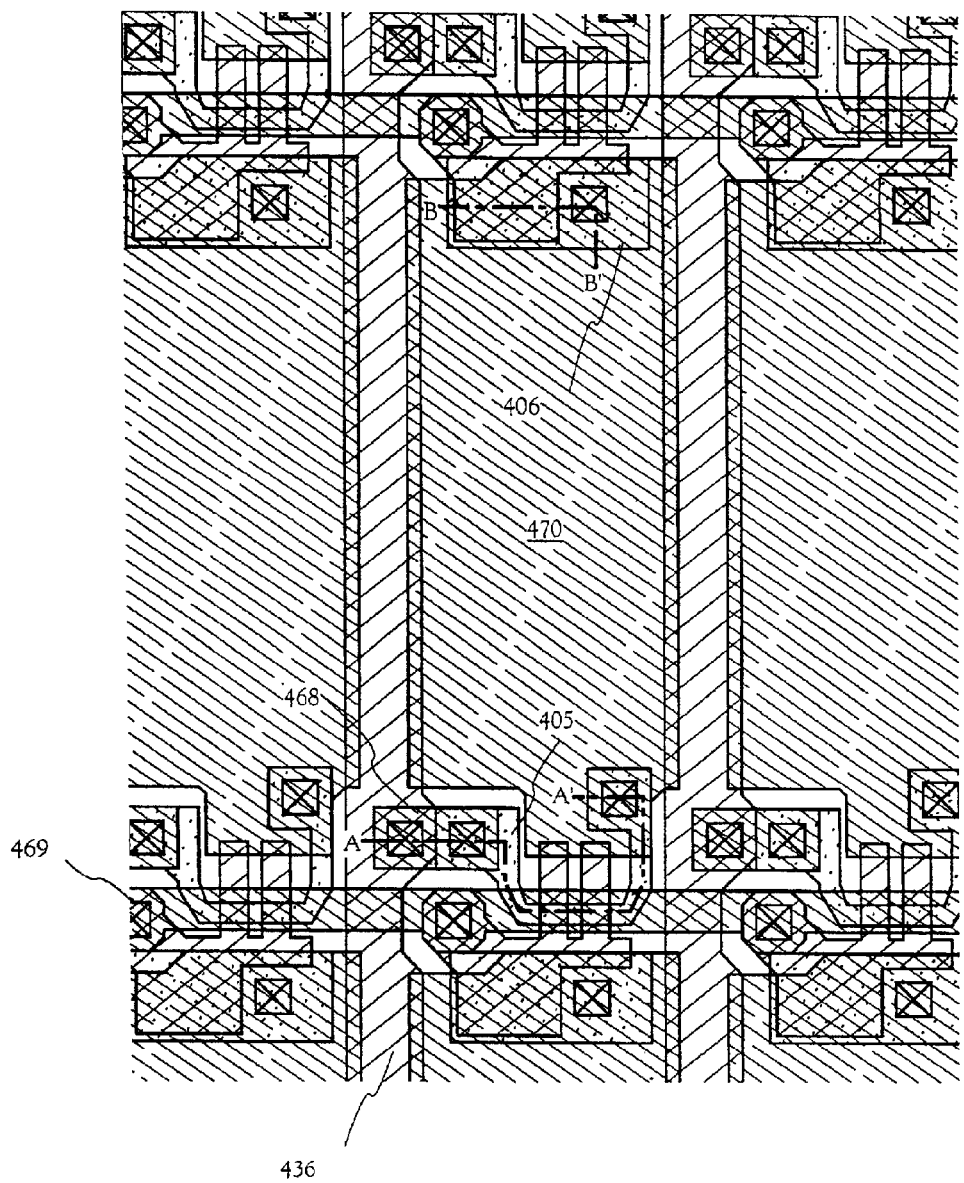
FIG. 8 is a top view showing pixels in a pixel portion of Embodiment 7.

A top view of the pixel portion of the active matrix substrate manufactured in this embodiment is shown in FIG. 8. Note that, the same reference numerals are used to indicate parts corresponding FIGS. 4A to 7C. A dash line A—A' in FIGS. 7A to 7C corresponds to a sectional view taken along the line A—A' in FIG. 8. Also, a dash line B—B' in FIGS. 7A to 7C corresponds to a sectional view taken along the line B—B' in FIG. 8.

This embodiment can be performed by freely combining with the embodiments 1 to 6.

[Embodiment 8]

Figure 9:
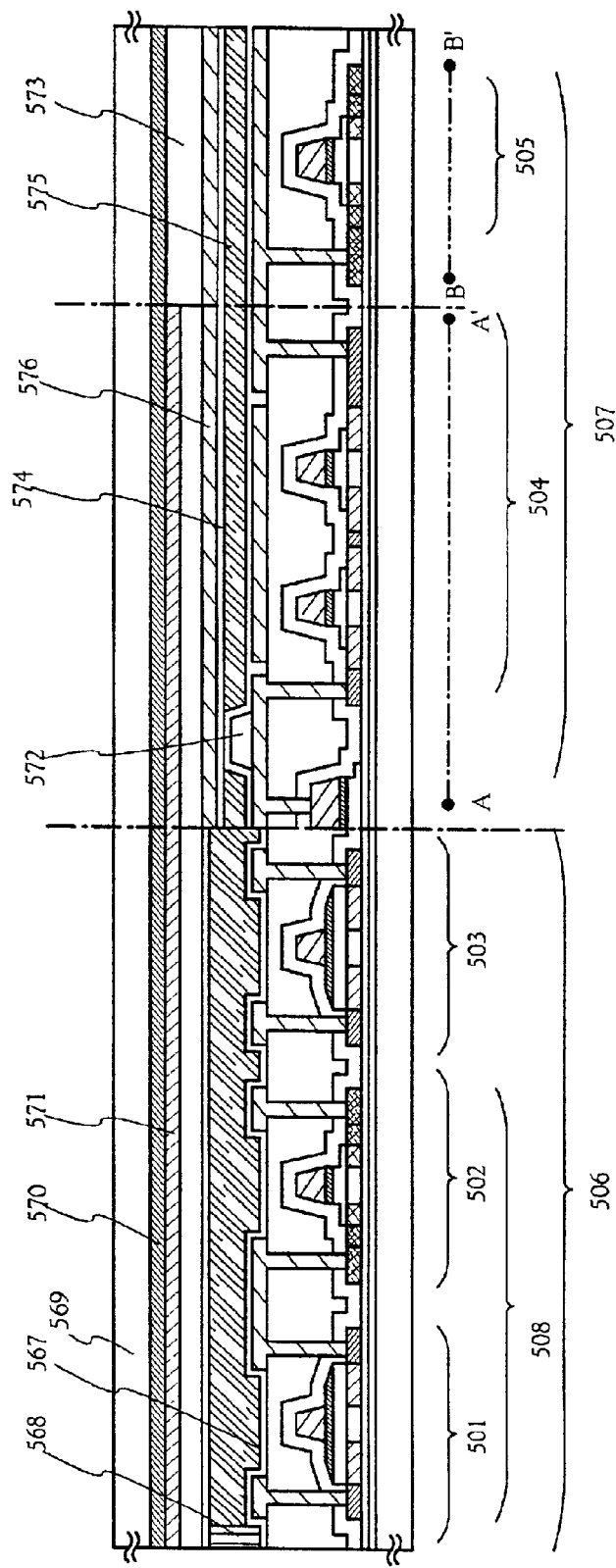
FIG. 9 is a cross-sectional view showing a process of manufacturing an active matrix liquid crystal display device of Embodiment 8.

In this embodiment, an explanation will be given as follows of steps of fabricating a reflection type liquid crystal display device from the active matrix substrate fabricated in Embodiment 7. FIG. 9 is used in the explanation.

First, in accordance with the embodiment 7, there is provided the active matrix substrate in the state of FIG. 7C and thereafter, an alignment film 567 is formed above the active matrix substrate of FIG. 7C, at least above the pixel electrode 470 and a rubbing processing is carried out. Further, in this embodiment, before forming the alignment film 567, by patterning an organic resin film such as an acrylic resin film, spacers in a columnar shape 572 are formed at desired positions in order to maintain an interval between substrates. Further, in place of the spacers in the columnar shape, spacers in a spherical shape may be scattered over an entire face of the substrate.

Next, an opposed substrate 569 is prepared. Successively, there are formed color layers 570 and 571 and a leveling film 573. A light shielding portion is formed by overlapping the color layer 570 of red color and the color layer 572 of blue color. Further, the light shielding portion may be formed by overlapping portions of a color layer of red color and a color layer of green color.

In this embodiment, there is used the substrate shown in Embodiment 7. Therefore, in FIG. 8 showing the top view of the pixel portion of Embodiment 7, it is necessary to shield at least a gap between the gate wiring 469 and the pixel electrode 470, a gap between the gate wiring 469 and the connection electrode 468 and a gap between the connection electrode 468 and the pixel electrode 470. In this embodiment, the respective color layers are arranged such that the light shielding portions constituted by laminating the color layers overlap positions to be shielded and the opposed substrate is pasted thereto.

A number of steps can be reduced by shielding the gaps among the respective pixels by the light shielding portions constituted by laminating the color layers in this way without forming light shielding layers such as black masks.

Next, the opposed electrode 576 constituted by a transparent conductive film is formed on the leveling film 573 at least at the pixel portion, an alignment film 574 is formed over an entire face of the opposed substrate and the rubbing processing is carried out.

Further, the active matrix substrate formed with the pixel portion and the drive circuit, and the opposed substrate are pasted together by seal member 568. The seal member 568 is mixed with fillers, and the two substrates are pasted together at a uniform interval therebetween by the fillers and columnar shape spacers. Thereafter, the interval between the two substrates is injected with a liquid crystal material 575 and is completely sealed by a seal agent (not illustrated). A well-known liquid crystal material may be used for the liquid crystal material 575. In this way, the reflection type liquid crystal display apparatus shown in FIG. 9 is finished. Further, as necessary, the active matrix substrate or the opposed substrate may be divided into a desired shape.

Further, a polarizer (not illustrated) is pasted to only the opposed substrate. Further, FPC is pasted thereto by using well-known technology.

The liquid crystal display panel fabricated in this way can be used as display portions of various electronic apparatus.

This embodiment can be performed by freely combining with the embodiments 1 to 7.

[Embodiment 9]

Figure 10:
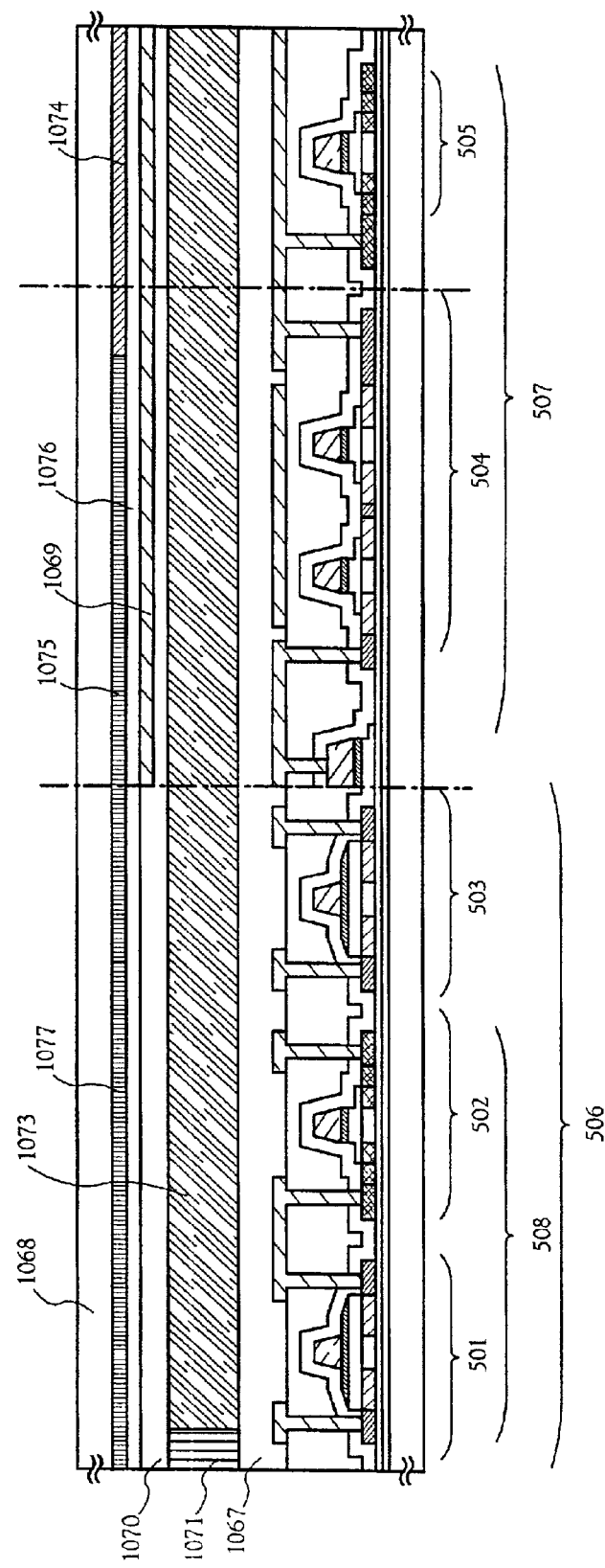
FIG. 10 is a cross-sectional view showing the process of manufacturing an active matrix liquid crystal display device of Embodiment 9.

In this embodiment, the manufacturing process of an active matrix liquid crystal display device which is different from that in Embodiment 8 from the active matrix substrate manufactured in Embodiment 7 is described below. FIG. 10 is used for explanation.

First, in accordance with Embodiment 7, the active matrix substrate in a state shown in FIG. 7C is obtained, and thereafter, an alignment film 1067 is formed on the active matrix substrate of FIG. 7C, and is subjected to a rubbing process. Note that, in this embodiment, before the formation of the alignment film 1067, a columnar spacer for maintaining a gap between the substrates is formed at a desired position by patterning an organic resin film such as an acrylic resin film. Further, spherical spacers may be scattered on the entire surface of the substrate in place of the columnar spacer.

Next, an opposing substrate 1068 is prepared. On the opposing substrate 1068, there are formed a colored layer 1074, a light shielding layer 1075 and color filters arranged to correspond to the respective pixels. Further, the driver circuit portion is also provided with a light shielding layer 1077. A leveling film 1076 is provided to cover the color filters and the light shielding layer 1077. Next, in the pixel portion an opposing electrode 1069 is formed from a transparent conductive film on the leveling film 1076, an alignment film 1070 is formed on the entire surface of the opposing substrate 1069, and a rubbing process is conducted thereon.

Then, the active matrix substrate on which a pixel portion and a driver circuit are formed is stuck with the opposing substrate by a sealing agent 1071. A filler is mixed in the sealing agent 1071, and the two substrates are stuck with each other while keeping a uniform gap by this filler and the columnar spacer. Thereafter, a liquid crystal material 1073 is injected between both the substrates to encapsulate the substrates completely by an encapsulant (not shown). A known liquid crystal material may be used as the liquid crystal material 1073. Thus, the active matrix liquid crystal display device shown in FIG. 10 is completed. Then, if necessary, the active matrix substrate and the opposing substrate are parted into desired shapes. In addition, by using a known technique, a polarizing plate or the like may be suitably provided. Then, an FPC is stuck with the substrate using a known technique.

The liquid crystal display panel obtained in this way can be used as a display portion of various electronic devices.

This embodiment can be performed by freely combining with the embodiments 1 to 7.

[Embodiment 10]

In this embodiment, an active matrix substrate on which the structure of TFTs is different from that on the substrate manufactured according to Embodiment 7 will be described. Then, a light emitting device manufactured according to the present invention will be described. Herein, a display panel in which light emitting elements formed on the substrate are encapsulated between the substrate and a covering member, and a display module formed by mounting an IC on the display panel are collectively referred to as the light emitting device. Incidentally, the light emitting element comprises a light emitting layer containing an organic compound which emits electroluminescence by application of an electrical field, an anode layer, and a cathode layer. There are two types of the electroluminescence emitted from organic compounds: one is fluorescence and the other is phosphorescence. Fluorescence is light emission that occurs upon return of electrons to their ground state from their singlet excited state, and phosphorescence is light emission that occurs upon return of electrons to their ground state from their triplet excited state. Here, the electroluminescence refers to either one or both types of the light emission described above.

Figure 11:
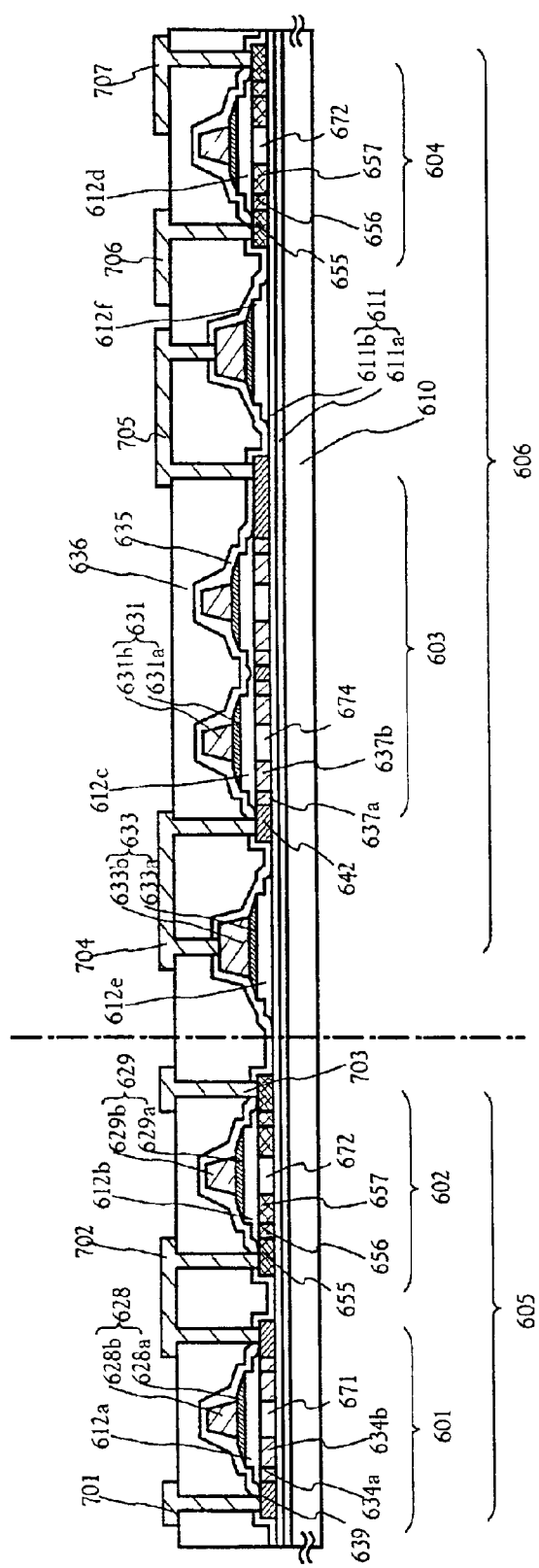
FIG. 11 is a cross-sectional view showing a process of manufacturing pixel TFTs and driver circuit TFTs of Embodiment 10.

A driver circuit 605 comprising an n-channel TFT 601 and a p-channel TFT 602 and a pixel portion 606 comprising a switching TFT 603 and a current controlling TFT 604 are formed on an active matrix substrate illustrated in FIG. 11.

These TFTs are manufactured by first forming a base film 611 including 611a and 611b over a substrate 610 and then providing a channel forming region, a source region, a drain region, an LDD region and the like in a semiconductor layer on the base film 611. The semiconductor layer is formed according to the present invention, as in Embodiments 1 through 7.

Gate electrodes 628 to 633 formed on a gate insulating film 612 respectively form a lamination structure comprising first conductive layers 628a to 633a and second conductive layers 628b to 633b. They are characterized in that the tips thereof are tapered. This tapered shape is formed by performing etching at least three times. By taking advantage of the shape of a gate electrode formed by each etching process, impurities are introduced into the semiconductor layer.

Specifically, a first etching process is performed to form first gate electrodes whose respective ends are tapered. Then, a first doping process is performed in a self-aligning manner using the first gate electrodes as masks, thereby forming a high concentration impurity region. Next, the second conductive layer is selectively etched to form second gate electrodes. A second doping process is then performed by using the tapered portions of the first conductive layer in the second gate electrodes to form a low concentration impurity region. Then, the tapered portions of the first conductive layer are partially etched to form third gate electrodes. At this point, an insulating film is also etched simultaneously to form an insulating film 612 (612a–612f). Thereafter, n-channel TFTs and the pixel portion are masked to perform a third doping process. Through this third doping process is formed an impurity region doped with an impurity element that imparts a conductivity type opposite to the above-mentioned conductivity type to the semiconductor layer that becomes an active layer for p-channel TFTs.

The LDD region formed by using the tapered portions of the second gate electrodes in the first conductive layer is provided to improve the reliability of the n-channel TFT. With this arrangement, deterioration of an on-state current resulting from a hot carrier effect is prevented. In the LDD region, by using an ion doping method, the ions of the impurity element are accelerated in the electric field. Then, the impurity element is introduced into the semiconductor film through the ends of the gate electrodes and the gate insulating film in the vicinity of the ends of the gate electrodes.

In this way, an LDD region 634 and a source or drain region 639 are formed on the outside of a channel forming region 671 of the n-channel TFT 601. A part of the LDD region 634, which is indicated by reference numeral 634b, is formed such that the gate electrode 628 is superposed over the part 634b. A region 634a is not overlapped with the gate electrode 628. The p-channel TFT 602 has the same configuration, and comprises a channel forming region 657, LDD regions 656 and 657, and a source or drain region 655. In this embodiment, the TFTs take on a single-gate structure. However, they may take on a double-gate structure or a triple-gate structure.

The switching TFT 603 formed of an n-channel TFT takes on a multi-gate structure in order to reduce an off-state current. An LDD region 637 (637a and 637b) and a source or drain region 642 are provided on the outside of a channel forming region 674. In the current controlling TFT 604 formed of a p-channel TFT, LDD regions 656 and 657, and a source or drain region 655 are provided on the outside of a channel forming region 672. In this embodiment, the current controlling TFT 604 takes on the single-gate structure. However, the current controlling TFT 604 may take on the double-gate structure or the triple-gate structure.

Interlayer insulating films comprise a first interlayer insulating film 635 having a thickness of 50 to 500 nm and a second interlayer insulating film 636. The first interlayer insulating film 635 is formed of an inorganic material such as silicon oxide, silicon nitride, or silicon oxynitride, and the second interlayer insulating film is formed of an organic insulating material such as polyimide, acrylic, polyimiamide, and BCB (benzocyclobutene). Forming the second interlayer insulating film of the organic insulating material in this manner allows the surface of the film to be satisfactorily flat. Further, generally, the dielectric constant of organic resin materials is low, so that the parasitic capacitance of the semiconductor device can be reduced. However, organic resin materials have hygroscopicity, so that they are not suited for use as a protective film. Accordingly, it is preferable that the second interlayer insulating film 636 is used in combination with the first interlayer insulating film 635.

Thereafter, a resist mask having a predetermined pattern is formed, and then contact holes that extend to the source regions or the drain regions formed on the respective semiconductor layers are formed. Formation of the contact holes is performed by dry etching. In this case, a mixture of $CF_4$, $O_2$, and He is used as an etching gas to first etch the second interlayer insulating film 636 formed of the organic resin material. Then, $CF_4$ and $O_2$ are used as the etching gas to etch the first interlayer insulating film 635.

Then, a conductive metal film is formed by sputtering or vacuum vapor deposition to form a resist mask pattern. Thereafter, wirings 701 to 707 are formed by etching. In this way, an active matrix substrate can be formed.

Figure 12:
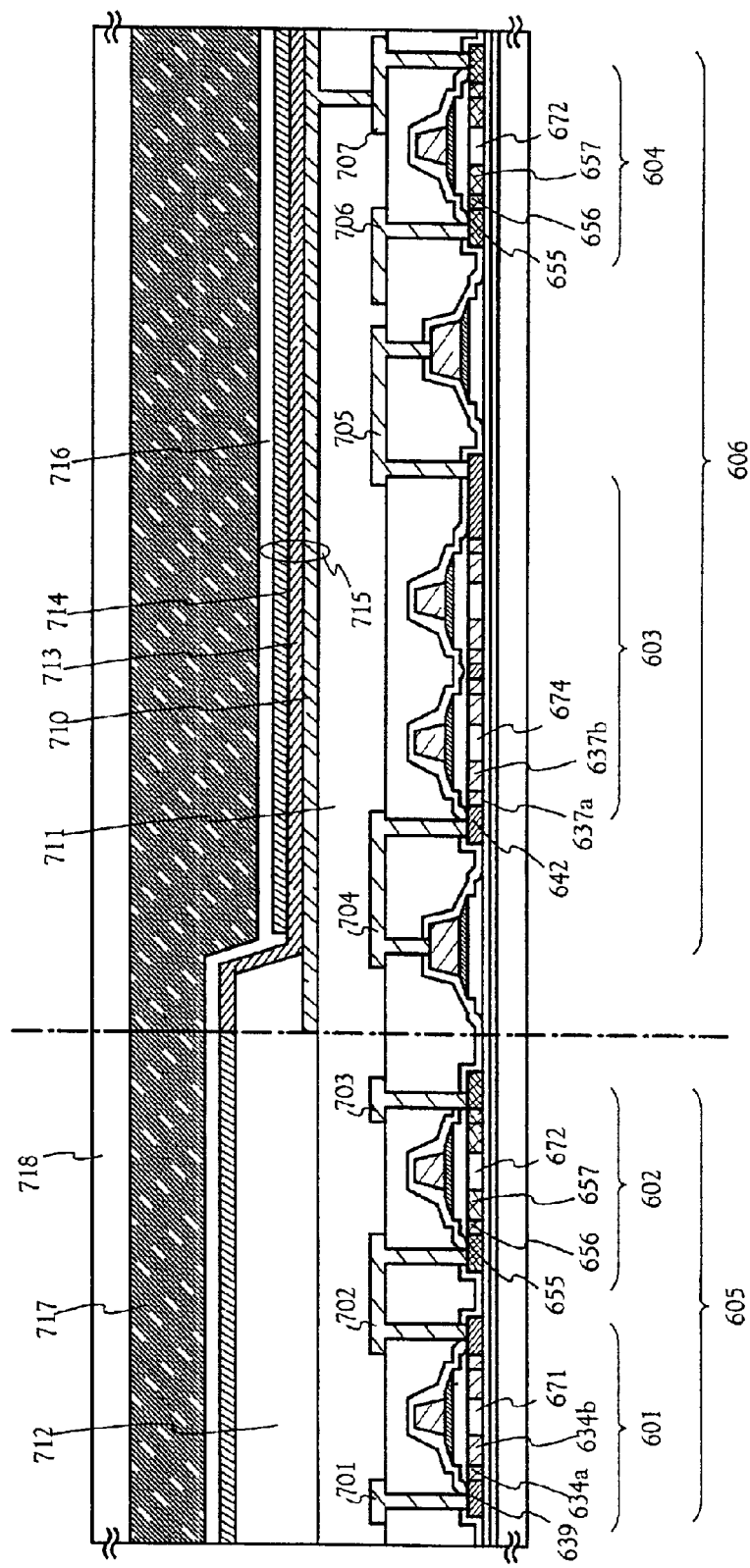
FIG. 12 is a cross-sectional view showing the structure of a driver circuit and a pixel portion in a light emitting device of Embodiment 10.

A light emitting device illustrated in FIG. 12 is manufactured by using the active matrix substrate in FIG. 11.

The wiring 706 is source wiring corresponding to a line for supplying a current to the current controlling TFT. Reference numeral 707 denotes an electrode to be electrically connected to a pixel electrode 710 of the current controlling TFT by superposing it over the pixel electrode 710.

Incidentally, the pixel electrode 710 is a pixel electrode (an anode for light emitting elements) formed of a transparent conductive film. A compound of indium oxide and tin oxide, a compound of indium oxide and zinc oxide, zinc oxide, tin oxide, or indium oxide can be employed for the transparent conductive film. Alternatively, the transparent conductive film doped with gallium may also be used. The pixel electrode 710 is formed on a flat interlayer insulating film 711 before the wirings described above are formed. In this embodiment, it is extremely important to use the flat film 711 formed of a resin to eliminate the level difference caused by TFTs. Since a light emitting layer to be formed later is very thin, the level difference sometimes cause faulty light emission. Accordingly, it is desirable to perform this flattening process before the pixel electrode is formed so as to allow the light emitting layer to be formed as flat as possible.

After the wirings 701 to 707 are formed, a bank 712 is formed, as illustrated in FIG. 12. The bank 712 may be formed by patterning an insulating film or an organic resin film having a thickness of 100 to 400 nm and containing silicon.

Since the bank 712 is an insulating film, care should be taken to avoid the static damage of elements at the time of formation of the bank. In this embodiment, the insulating film that forms the bank 712 is doped with carbon particles or metal particles to reduce resistivity, thereby suppressing generation of static electricity. At this time, the doping amount of the carbon particles or the metal particles should be adjusted so that the resistivity becomes $1 \times 10^6$ to $1 \times 10^{12}$ Ωm, preferably from $1 \times 10^8$ to $1 \times 10^{10}$ Ωm.

A light emitting layer 713 is formed on the pixel electrode 710. Though the layer for a single pixel is illustrated in FIG. 12, light emitting layers each corresponding to the colors of R (red), G (green), and B (blue) are formed separately in this embodiment. In this embodiment, a low molecular organic light emitting material layer is formed by vapor deposition. Specifically, the light emitting layer 713 is formed by laminating a tris-8-quinolinolate aluminum ($Alq_3$) complex film having a thickness of 70 nm as a light emitting layer over a copper phthalocyanine (CuPc) film having a thickness of 20 nm as a hole injecting layer. Addition of a fluorescent pigment such as quinacridone, perylene, or DCM 1 enables control of a light emitting color.

The materials described above are examples of organic light emitting materials that can be used for the light emitting layer, and the present invention is not limited to these materials. The light emitting layer, and a charge transporting layer or a charge injecting layer may be combined freely to form a light emitting layer used for light emission and for causing carrier movement necessary for the light emission. In this embodiment, a description was directed to the case where a low molecular organic light emitting material is employed for the light emitting layer. A high molecular (polymer) organic light emitting material, however, may also be used. Further, an inorganic material such as silicon carbide can also be employed for the charge transporting layer or the charge injecting layer. A well-known material can be used for these organic light emitting material and inorganic material.

Next, a cathode 714 comprising the conductive film is provided on the light emitting layer 713. In this embodiment, an alloy film of aluminum and lithium is used as the conductive film. Of course, a well-known Mg—Ag film, which is an alloy film of magnesium and silver, may also be used. The conductive film made from an element belonging to Group 1 or Group 2 of the periodic table or the conductive film doped with these elements should be employed for forming the cathode.

Upon formation of the cathode 714, a light emitting element 715 is completed. Herein, the light emitting element 715 refers to diodes that comprises the pixel electrode (anode) 710, light emitting layer 713, and cathode 714.

It is effective to provide a passivation film 716 so as to completely cover the light emitting element 715. An insulating film including a carbon film, the silicon nitride film, or the silicon oxynitride film is used as the passivation film 716. A single layer of one of these films or lamination obtained by combining these films is used.

In this case, it is preferable that a film providing good coverage is used as the passivation film. It is particularly effective to use a carbon film, especially a DLC (diamond-like carbon) film for this purpose. The DLC film can be formed in a temperature range of room temperature to 100° C. or lower. Thus, the DLC film can be readily formed even in a region above the light emitting layer 713 having a low heat resistance. Further, the DLC film has a high blocking effect against oxygen, so that oxidation of the light emitting layer 713 can be suppressed. For this reason, oxidation of the light emitting layer 713 during a subsequent sealing process can be prevented.

Further, a sealant 717 is provided over the passivation film 716, and a covering member 718 is bonded to the sealant 717. An ultraviolet curable resin may be used for the sealant 717, and it is effective to provide therein a substance that has the effect of absorbing moisture or preventing oxidation. In this embodiment, the covering member 718 made by forming carbon films, preferably the diamond-like carbon films, over both of the upper and lower surfaces of a glass substrate, quartz substrate, or plastic substrate including a plastic film is employed.

In this way, the light emitting device having a structure such as illustrated in FIG. 12 is completed. Incidentally, after formation of the bank 712, it is effective to use a multi-chamber type film forming device or an in-line type film forming device to continuously perform the processing steps up to formation of the passivation film 716, without exposure to atmosphere. Further, it is also possible to continuously perform the processing steps up to affixing of the covering member 718 without exposure to atmosphere.

In this way, the n-channel TFTs 601 and 602, the n-channel switching TFT 603, and the n-channel current controlling TFT 604 are formed over the substrate 610. The number of masks required in the manufacturing process up to this point is less than that required for a typical active matrix light emitting device.

More specifically, the TFT manufacturing process is substantially simplified, so that improvement in production yields and reduction in manufacturing costs can be realized.

Further, as described with reference to FIGS. 11 and 12, the impurity region is provided such that the gate electrode is superposed over the region through the insulating film. With this arrangement, an n-channel TFT that is resistant against deterioration resulting from the hot carrier effect can be formed. Therefore, a light emitting device with a high degree of reliability can be realized.

In this embodiment, only the pixel portion and the driver circuit are shown. However, according to the manufacturing process of this embodiment, in addition to these, a signal dividing circuit, a D/A converter, an operational amplifier, a logic circuit such as a γ correction circuit can be formed on the same insulator. Further, a memory and a microprocessor can also be formed.

A light emitting device according to this embodiment after the sealing (or encapsulating) process for protecting the light emitting elements has been performed will be described with reference to FIGS. 13A and 13B. Like parts are indicated by like reference numerals in FIG. 12, as necessary.

FIG. 13A is a top view showing a state where the light emitting element has been sealed, and FIG. 13B is a cross-sectional view of FIG. 13A through a line C—C'. Reference numeral 801 indicated by a dotted line denotes a source driver circuit, reference numeral 806 denotes a pixel portion, and reference numeral 807 denotes a gate driver circuit. Reference numeral 901 denotes a covering member, reference numeral 902 denotes a first sealing member, and reference numeral 903 denotes a second sealing member. A sealant 907 is provided inside an area enclosed by the first sealing member 902.

Reference numeral 904 denotes wiring for transmitting a signal to be supplied to a source driver circuit 801 and a gate driver circuit 807. The wiring 904 receives a video signal and a clock signal from a FPC (flexible printed circuit) 905 that is an external input terminal. Incidentally, though only the FPC is illustrated in this drawing, a printed wiring board (PWB) may be attached to the FPC. The light emitting device herein refers not only to the main body of the light emitting device but also to the device to which the FPC or the PWB is attached.

Next, a cross-sectional structure of the light emitting device will be described with reference to FIG. 13B. The pixel portion 806 and the gate driver circuit 807 are formed on the substrate 700. The pixel portion 806 is composed of the current controlling TFT 604 and a plurality of pixels including the pixel electrode 710 electrically connected to the drain of the current controlling TFT 604. The gate driver circuit 807 is formed by using a CMOS circuit combining the n-channel TFT 601 and the p-channel TFT 602 (refer to FIG. 12).

The pixel electrode 710 functions as the anode for the light emitting elements. The banks 712 are formed on both sides of the pixel electrode 710. The light emitting layer 713 and the cathode 714 for the light emitting elements are formed on the picture electrode 710.

The cathode 714 also functions as the wiring common to all the pixels, and is electrically connected to the FPC 905 via the connection wiring 904. All the elements contained in the pixel portion 806 and the gate driver circuit 807 are covered with the cathode 714 and the passivation film 716.

The covering member 901 is bonded by the first sealing member 902. Spacers formed of a resin film may also be provided so as to ensure spacing between the covering member 901 and the light emitting element. Then, the area inside the first sealing member 902 is filled with a sealant 907. Preferably, an epoxy resin is used for the first sealing member 902 and the sealant 907. Further, preferably, the first sealing member 902 is formed of a material that is permeable to water and oxygen as much as possible. Still further, a substance that has the effect of absorbing moisture or preventing oxidation may be contained in the sealant 907.

The sealant 907 provided to cover the light emitting element also functions as an adhesive for bonding the covering member 901. In this embodiment, FRP (fiberglass-reinforced plastics), PVF (polyvinyl fluoride), Mylar, polyester, or acrylic can be employed for a material of the covering member 901.

After the covering member 901 is bonded using the sealant 907, the second sealing member 903 is provided to cover the sides (exposed surface) of the sealant 907. As a material for the second sealing members 903, the same material as that for the first sealing member 902 can be employed.

Encapsulation of the light emitting element in the sealant 907 with the arrangement described above allows the light emitting element to be completely blocked from the outside. Entering of a substance such as water or oxygen from the outside, which accelerates deterioration of the light emitting layer by causing oxidation thereof can be thereby prevented. Therefore, the light emitting device with a high degree of reliability can be obtained.

This embodiment can be freely combined with Embodiments 1 thorough 7.

[Embodiment 11]

In this embodiment, a light emitting device having a pixel structure different from that in Embodiment 10 will be described with reference to FIG. 14.

Figure 14:
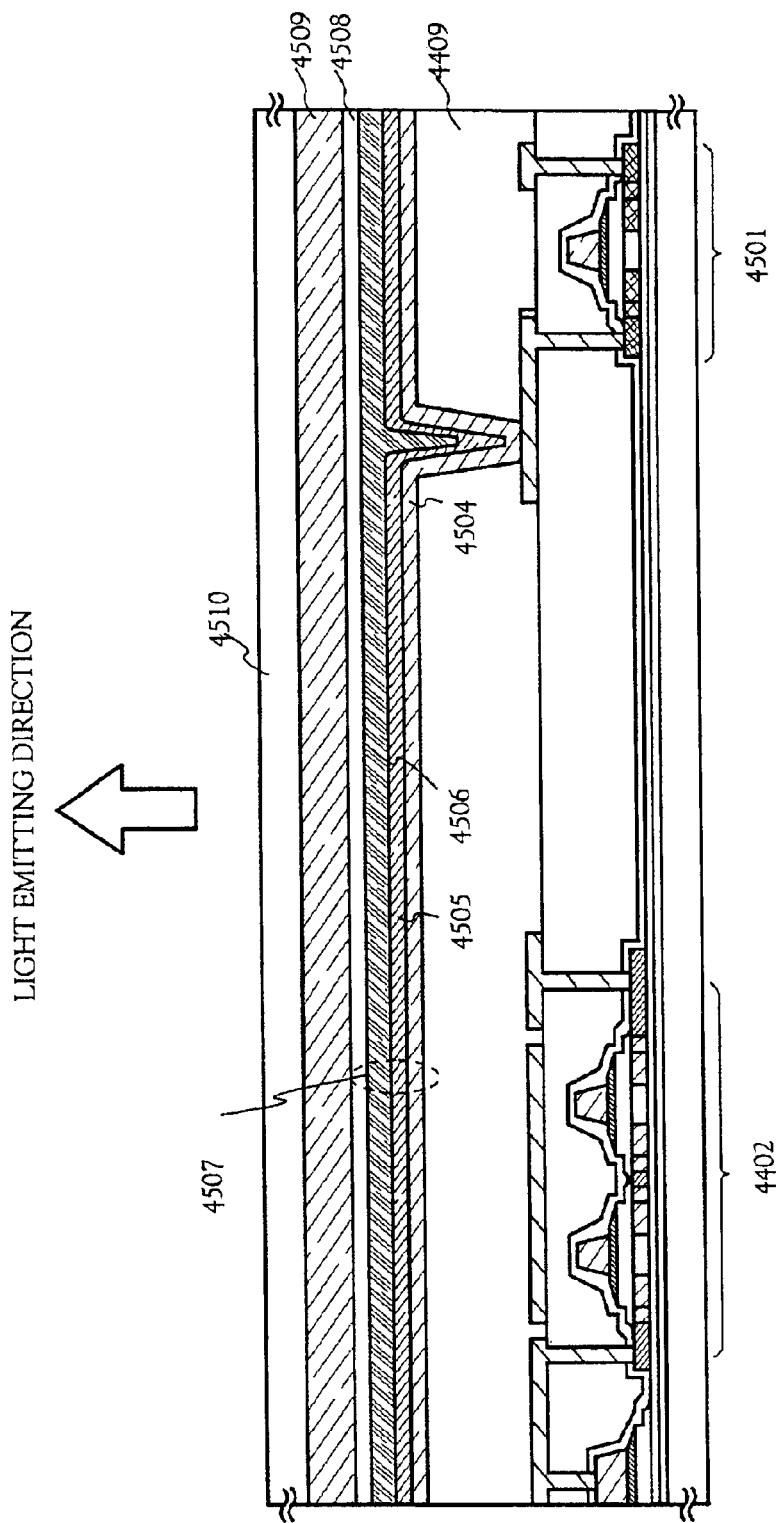
FIG. 14 is a cross-sectional view showing the structure of a pixel portion in a light emitting device of Embodiment 11.

Referring to FIG. 14, a TFT that has the same structure as the n-channel TFT 601 in FIG. 11 is employed as a current controlling TFT 4501. The gate electrode of the current controlling TFT 4501 is of course electrically connected to the drain wiring of a switching TFT 4402. The drain wiring of the current controlling TFT 4501 is electrically coupled to a pixel electrode 4504. Note, reference numeral 4409 indicates an interlayer insulating film.

In this embodiment, the pixel electrode 4504 formed of a conductive film functions as the cathode for light emitting elements. Specifically, an alloy film of aluminum and lithium is employed for the pixel electrode 4504. Here, a conductive film made from an element belonging to Group 1 or Group 2 of the periodic table, or a conductive film doped with these elements may be employed.

A light emitting layer 4505 is formed over the pixel electrode 4504. Though only one pixel is illustrated in FIG. 14, a light emitting layer that emits a color of light corresponding to G (green) is formed by the vapor deposition method or the coating method (preferably spin coating) in this embodiment. Specifically, the light emitting layer 4505 comprises layered lamination of a film of lithium fluoride having a thickness of 20 nm as an electron injecting layer and a PPV (polyparaphenylenevinylene) film having a thickness of 70 nm superimposed thereon as the light emitting layer.

Next, an anode 4506 formed of a transparent conductive film is provided on the light emitting layer 4505. In this embodiment, a conductive film formed of a compound of indium oxide and tin oxide or a compound of indium oxide and zinc oxide is employed as the transparent conductive film.

Upon formation of the anode 4506, light emitting elements 4507 are completed. The light emitting elements 4507 herein refer to diodes composed of the pixel electrode (cathode) 4504, light emitting layer 4505, and anode 4506.

It is effective to provide a passivation film 4508 such that the light emitting elements 4507 are completely covered with the passivation film. The passivation film 4508 is formed of an insulating film including a carbon film, silicon nitride film, or silicon oxynitride film. A single layer of one of these films or a lamination of these films is used.

Further, a sealant 4509 is provided over the passivation film 4508, and a covering member 4510 is bonded to the sealant 4509. The ultraviolet curable resin may be used for the sealant 4509, and it is effective to provided therein the substance that has the effect of absorbing moisture or preventing oxidation. In this embodiment, the covering member 4510 made by forming carbon films, preferably diamond-like carbon films, on both sides of the glass substrate, quartz substrate, or plastic substrate including the plastic film is employed.

This embodiment can be freely combined with Embodiments 1 through 7.

[Embodiment 12]

In this embodiment, an active matrix substrate having a TFT structure different from that on the substrate manufactured according to Embodiments 7 and 10 will be described. Then, a liquid crystal display device manufactured according to the present invention will be described.

Figure 15A:
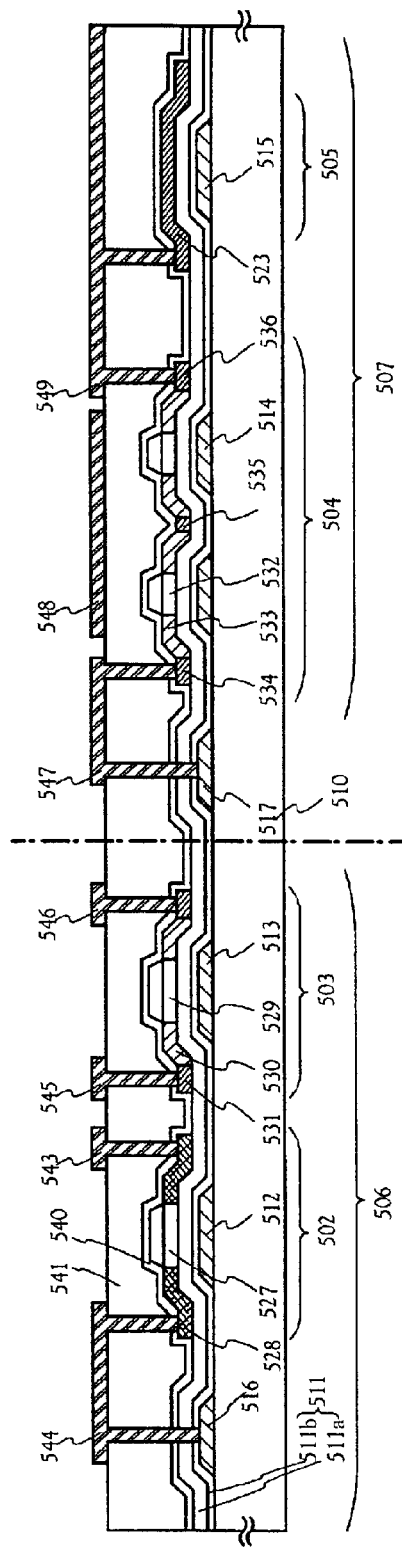
FIGS. 15A and 15B are a cross-sectional view showing a process of manufacturing an active matrix substrate and a cross-sectional view showing a process of manufacturing an active matrix liquid crystal display device, respectively, of Embodiment 12.

On an active matrix substrate illustrated in FIG. 15A, a driver circuit 506 comprising an n-channel TFT 503 and a p-channel TFT 502 and a pixel portion 507 comprising a pixel TFT 504 and a storage capacitor 505 are formed.

These TFTs are manufactured by first forming gate wirings 512 to 517 over a substrate 510, forming an insulating film 511 (511*a* and 511*b*) over the gate wirings, and then providing the channel forming region, source region, drain region, and LDD region or the like for the semiconductor layer on the insulating film. The semiconductor layer is formed according to the present invention, as in Embodiments 1 through 7.

The gate wirings 512 to 517 are formed with a thickness of 200 to 400 nm, preferably a thickness of 250 nm, and the ends of the gate wirings are tapered so as to improve the step coverage of the films to be formed thereon. The angle of the tapered portions is from 5 to 30 degrees, preferably from 15 to 25 degrees. The tapered portions are formed by dry etching. The angle of the tapered portions is controlled by the etching gas and a bias applied to the substrate.

Impurity regions are formed by first through third doping processes. First, the first doping process is carried out to form an LDD (lightly doped drain) region of the n-channel TFT. The doping may be carried out by ion doping or ion implantation. Phosphorus is doped as an impurity element (donor) for imparting the n-type conductivity, and first impurity regions 530 and 533 are formed by means of a mask. Then, another mask for covering the LDD region of the n-channel TFT is formed, and the second doping process is carried out to form the source and drain regions of the n-channel TFT.

Then, the third doping process is carried out to form the source and drain regions of the p-channel TFT. The doping may be carried out by adding an impurity element (acceptor) for imparting the p-type conductivity by ion doping or ion implantation. Since the portions of the semiconductor layer on which the n-channel TFTs are formed are masked, the impurity element for imparting the p-type conductivity is not introduced into those portions. In this embodiment, the LDD region of the p-channel TFT is not formed. However, the LDD region may of course be formed.

In this way, the LDD region 530 and a source or drain region 531 are formed outside of a channel forming region 529 in the n-channel TFT 503. The p-channel TFT 502 has the similar structure, and is comprised of a channel forming region 527 and a source or drain region 528. In this embodiment, the TFTs take on the single-gate structure. However, they may also take on the double-gate structure or the triple-gate structure.

In the pixel portion 507, the pixel TFT 504 formed of an n-channel TFT takes on the multi-gate structure in order to reduce the off-state current. The LDD region 533 and a source or drain region 534 are provided outside of a channel forming region 532. Further, regions 535 and 536 are added with the n-type impurity element. In addition, a semiconductor region 523 in the storage capacitor 505 is introduced with an impurity element (in this embodiment, the n-type impurity).

The interlayer insulating films comprise a first interlayer insulating film 540 and a second interlayer insulating film 541. The first insulating film 540 is formed of an inorganic material such as silicon oxide, silicon nitride, or silicon oxynitride, and has a thickness of 50 to 500 nm. The second interlayer insulating film 541 is formed of an organic insulating material such as polyimide, acrylic, polyimiamide, and BCB (benzocyclobutene). Forming the second interlayer insulating film of the organic insulating material in this manner allows the surface of the film to be satisfactorily flat. Further, generally, the dielectric constant of organic resin materials is low, so that the parasitic capacitance can be reduced. However, organic materials have hygroscopicity, so that they are not suited for use as the protective film. Accordingly, it is preferable that the second interlayer insulating film 541 is formed in combination with the first interlayer insulating film 540.

Thereafter, a resist mask having a predetermined pattern is formed, and then contact holes that extend to the source regions or the drain regions formed in the respective semiconductor layers are formed. Formation of the contact holes is performed by dry etching. In this case, a mixture of $CF_4$, $O_2$, and He is used as the etching gas to first etch the second interlayer insulating film 541 formed of the organic resin material. Then, $CF_4$ and $O_2$ are used as the etching gas to etch the first interlayer insulating film 540.

Then, a conductive metal film is formed by sputtering or vacuum deposition to form a resist mask pattern. Thereafter, wirings 543 to 549 are formed by etching. An active matrix substrate can be formed in this way.

Figure 15B:
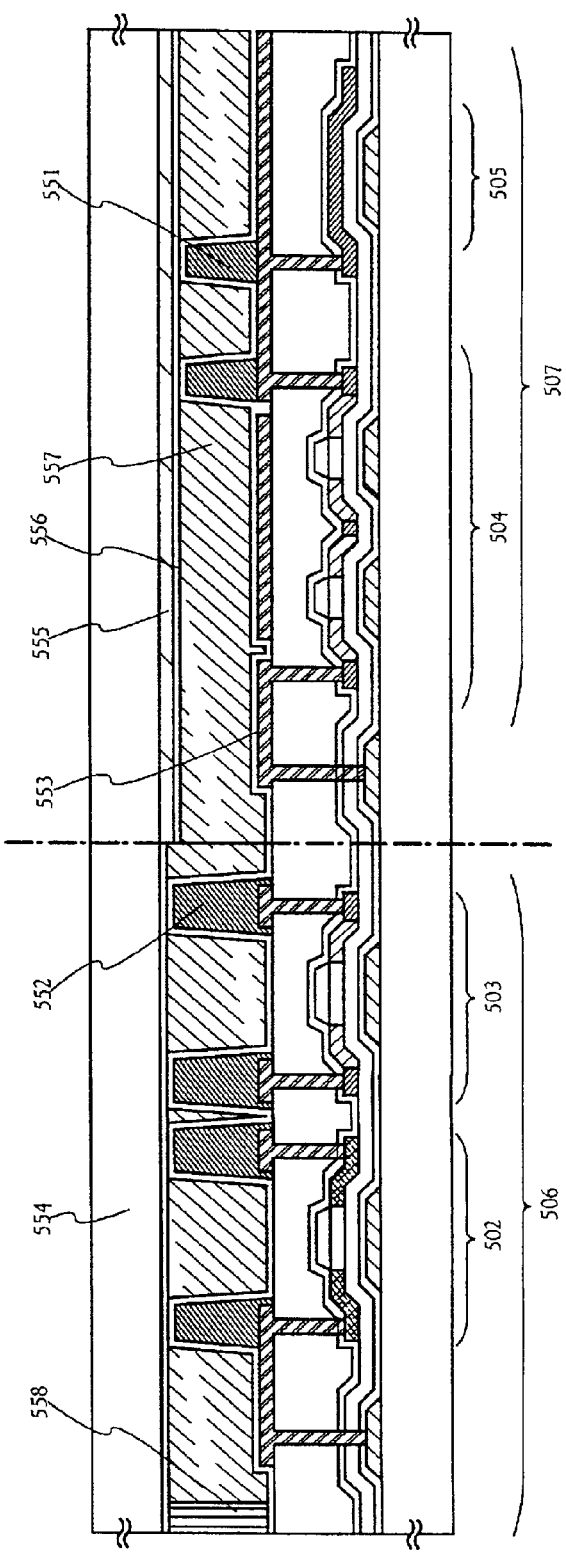

A process of manufacturing an active matrix liquid display using the active matrix substrate in FIG. 15A will be described. FIG. 15B shows the state where the active matrix substrate and an opposing substrate 554 are bonded together by means of a sealing member 558. First, columnar spacers 551 and 552 are formed on the active matrix substrate in FIG. 15A. The spacers 551 for the pixel portion are provided so as to be overlaid upon contact portions of the pixel electrode. Though varying according to a liquid crystal material used in the device, the height of the spacer is arranged to be three to 10 μm. In the contact portions, concave portions corresponding to the contact holes are formed. Therefore, by forming the spacers at positions to coincide with these concave portions below, derangement of the orientation of liquid crystals can be prevented. Thereafter, an orientation film (an alignment film) 553 is formed to carry out a rubbing process. A transparent conductive film 555 and an orientation film 556 are formed on the opposing substrate 554. Thereafter, the opposing substrate and the active matrix substrate are bonded together to inject the liquid crystal material 557.

The active matrix liquid crystal display devices manufactured as described above can be used as displays for various electronic devices.

This embodiment can be freely combined with Embodiments 1 thorough 7.

[Embodiment 13]

In this embodiment, a light emitting device manufactured with the active matrix substrate illustrated in Embodiment 12 will be described.

Figure 16:
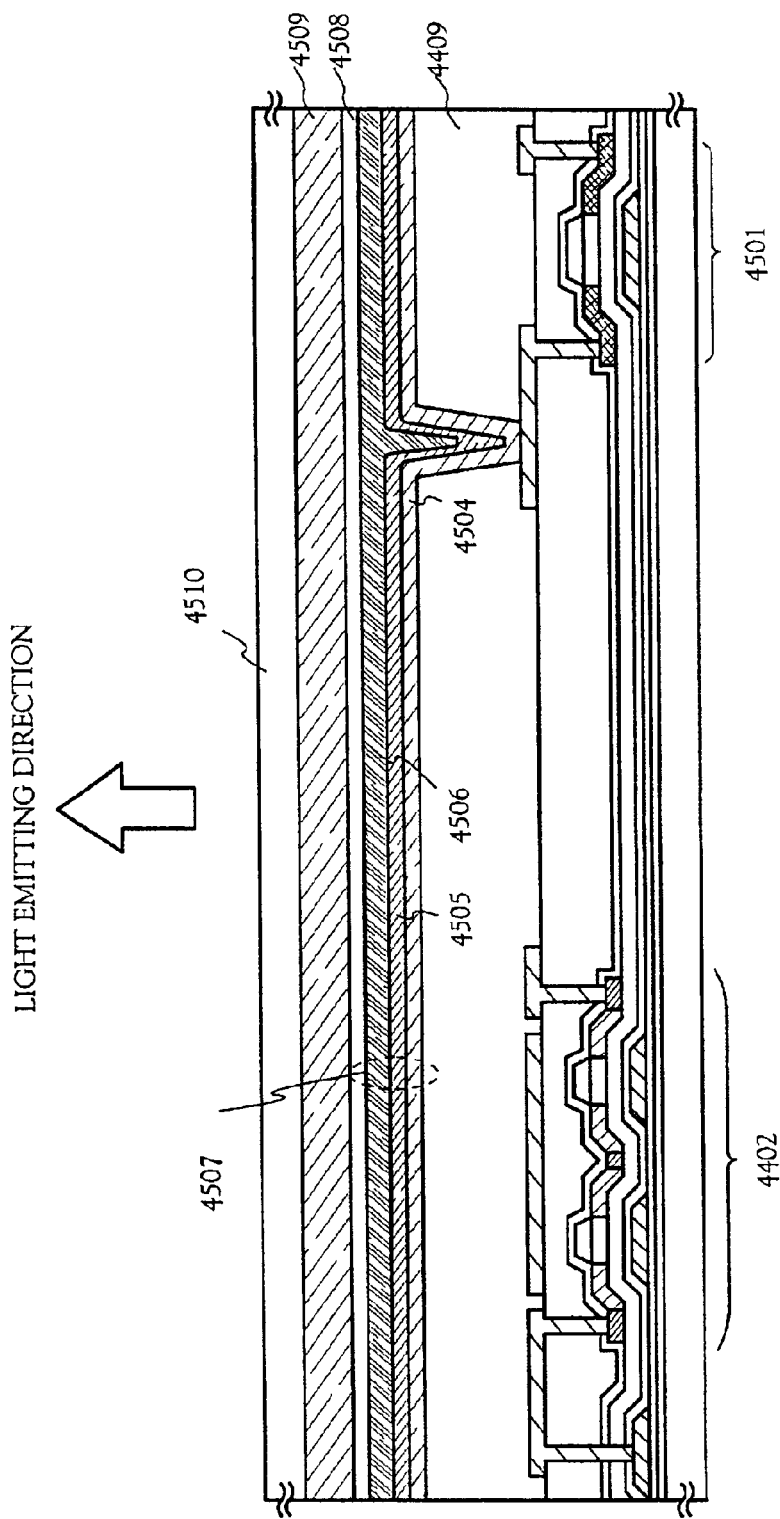
FIG. 16 is a cross-sectional view showing the structure of a pixel portion in a light emitting device of Embodiment 13.

Referring to FIG. 16, a TFT that has the same structure as the n-channel TFT 503 in FIGS. 15A and 15B is employed as the current controlling TFT 4501. The gate electrode of the current controlling TFT 4501 is, of course, electrically connected to the drain wiring of the switching TFT 4402. The drain wiring of the current controlling TFT 4501 is electrically connected to the pixel electrode 4504.

In this embodiment, the pixel electrode 4504 formed of a conductive film functions as the cathode for light emitting elements. Specifically, an alloy film of aluminum and lithium is employed for the pixel electrode 4504. Here, a conductive film made from an element belonging to Group 1 or Group 2 of the periodic table, or a conductive film doped with these elements may be employed.

The light emitting layer 4505 is formed over the pixel electrode 4504. Though only one pixel is illustrated in FIG. 16, a light emitting layer that emits the color of light corresponding to G (green) is formed by the vapor deposition method or the coating method (preferably spin coating) in this embodiment. Specifically, the light emitting layer 4505 comprises layered lamination of the film of lithium fluoride (Lif) having a thickness of 20 nm as the electron injecting layer and the PPV (polyparaphenylenevinylene) film having a thickness of 70 nm superimposed thereon as the light emitting layer.

Next, the anode 4506 formed of a transparent conductive film is provided on the light emitting layer 4505. In this embodiment, a conductive film formed of a compound of indium oxide and tin oxide or a compound of indium oxide and zinc oxide is employed as the transparent conductive film.

Upon formation of the anode 4506, the light emitting elements 4507 are completed. The light emitting elements 4507 herein refer to diodes that comprise the pixel electrode (cathode) 4504, light emitting layer 4505, and anode 4506.

It is effective to provide the passivation film 4508 such that the light emitting elements 4507 are completely covered with the film. The passivation film 4508 is formed of an insulating film including a carbon film, silicon nitride film, or silicon oxynitride film. A single layer of one of these films or a lamination of these films is used.

Further, the sealant 4509 is provided over the passivation film 4508, and the covering member 4510 is bonded to the sealant 4509. An ultraviolet curable resin may be used for the sealant 4509, and it is effective to provide therein the substance that has the effect of absorbing moisture or preventing oxidation. In this embodiment, the covering member 4510 made by forming carbon films, preferably diamond-like carbon films, on both sides of the glass substrate, quartz substrate, or plastic substrate including the plastic film is employed.

Note that, this embodiment can be freely combined with Embodiment 1 through 7 and Embodiment 12.

[Embodiment 14]

The CMOS circuit and the pixel portion formed by applying the present invention can be applied to various electro-optic devices (active matrix type liquid crystal display device, active matrix type EC display device or active matrix type light emitting device). Specifically, the present invention can be embodied in electronic equipment of any type in which such an electro-optic device is incorporated in a display part.

Such electronic equipment is a video camera, a digital camera, a projector, a head-mounted display (goggle type display), a car navigation system, a car stereo, a personal computer, or a mobile information terminal (such as a mobile computer, a mobile telephone or an electronic book). FIGS. 17A–17F, 18A–18D, and 19A–19C show one of its examples.

FIG. 17A shows a personal computer which includes a body 3001, an image input part 3002, a display part 3003, a keyboard 3004 and the like. The invention can be applied to the display part 3003.

FIG. 17B shows a video camera which includes a body 3101, a display part 3102, a sound input part 3103, operating switches 3104, a battery 3105, an image receiving part 3106 and the like. The invention can be applied to the display part 3102.

FIG. 17C shows a mobile computer which includes a body 3201, a camera part 3202, an image receiving part 3203, an operating switch 3204, a display part 3205 and the like. The invention can be applied to the display part 3205.

FIG. 17D shows a goggle type display which includes a body 3301, a display part 3302, arm parts 3303 and the like. The invention can be applied to the display part 3302.

FIG. 17E shows a player using a recording medium on which a program is recorded (hereinafter referred to as the recording medium), and the player includes a body 3401, a display part 3402, speaker parts 3403, a recording medium 3404, operating switches 3405 and the like. This player uses a DVD (Digital Versatile Disc), a CD and the like as the recording medium, and enables a user to enjoy music, movies, games and the Internet. The invention can be applied to the display part 3402.

FIG. 17F shows a digital camera which includes a body 3501, a display part 3502, an eyepiece part 3503, operating switches 3504, an image receiving part (not shown) and the like. The invention can be applied to the display part 3502.

Figure 18A:
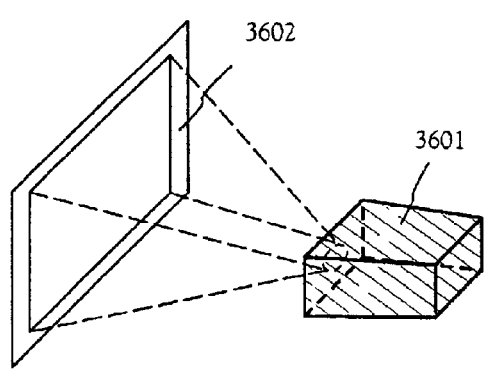
FIGS. 18A to 18D show examples of electronic apparatuses of Embodiment 14.

FIG. 18A shows a front type projector which includes a projection device 3601, a screen 3602 and the like. The invention can be applied to a liquid crystal display device 3808 which constitutes part of the projection device 3601 as well as other driver circuits.

Figure 18B:
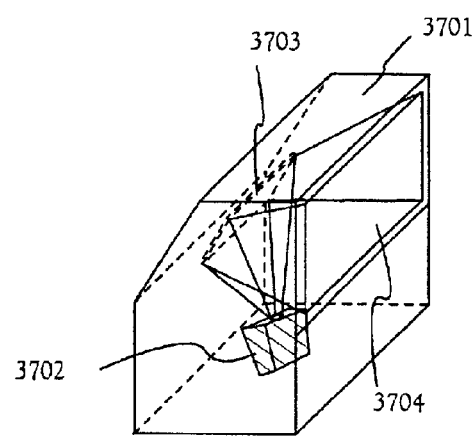

FIG. 18B shows a rear type projector which includes a body 3701, a projection device 3702, a mirror 3703, a screen 3704 and the like. The invention can be applied to the liquid crystal display device 3808 which constitutes part of the projection device 3702 as well as other driver circuits.

Figure 18C:
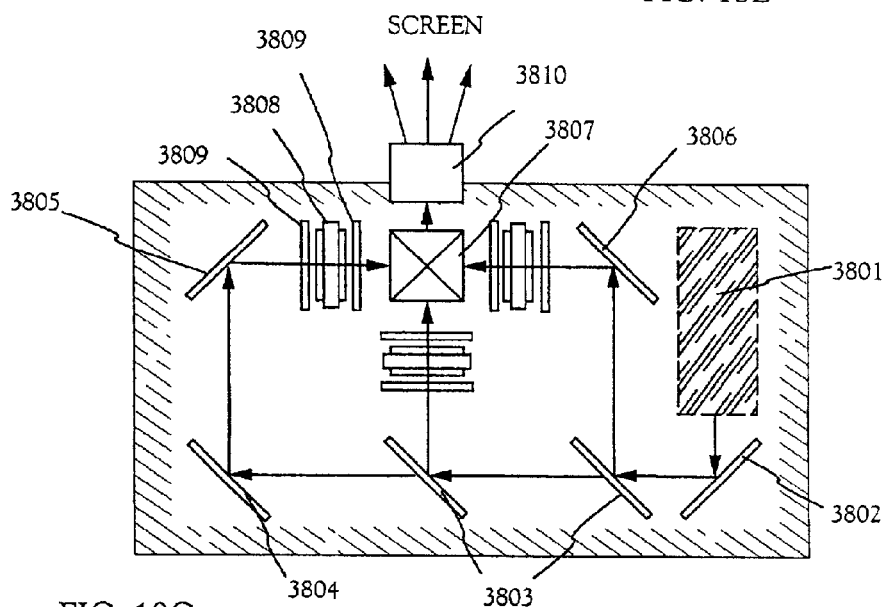

FIG. 18C shows one example of the structure of each of the projection devices 3601 and 3702 which are respectively shown in FIGS. 18A and 18B. Each of the projection devices 3601 and 3702 is made of a light source optical system 3801, mirrors 3802 and 3804 to 3806, a dichroic mirror 3803, a prism 3807, a liquid crystal display device 3808, a phase difference plate 3809 and a projection optical system 3810. The projection optical system 3810 is made of an optical system including a projection lens. Embodiment 14 is an example of a three-plate type, but it is not limited to this example and may also be of a single-plate type. In addition, those who embody the invention may appropriately dispose an optical system such as an optical lens, a film having a polarization function, a film for adjusting phase difference or an IR film in the path indicated by arrows in FIG. 18C.

Figure 18D:
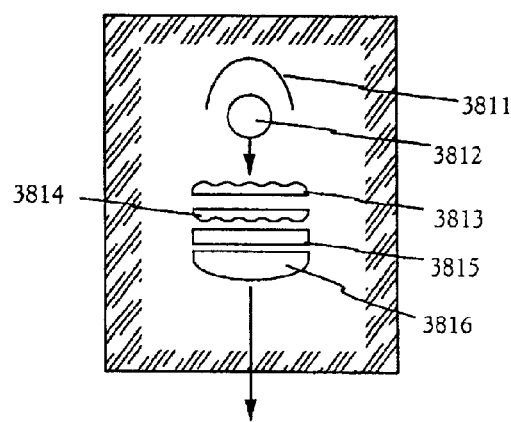

FIG. 18D is a view showing one example of the structure of the light source optical system 3801 shown in FIG. 18C. In Embodiment 14, the light source optical system 3801 is made of a reflector 3811, a light source 3812, lens arrays 3813 and 3814, a polarizing conversion element 3815 and a condenser lens 3816. Incidentally, the light source optical system shown in FIG. 18D is one example, and the invention is not particularly limited to the shown construction. For example, those whose embody the invention may appropriately dispose an optical system such as an optical lens, a film having a polarization function, a film for adjusting phase difference or an IR film.

The projector shown in FIGS. 18A to 18D is of the type using a transparent type of electro-optic device, but there is not shown an example in which the invention is applied to a reflection type of electro-optic device and a light-emitting device.

Figure 19A:
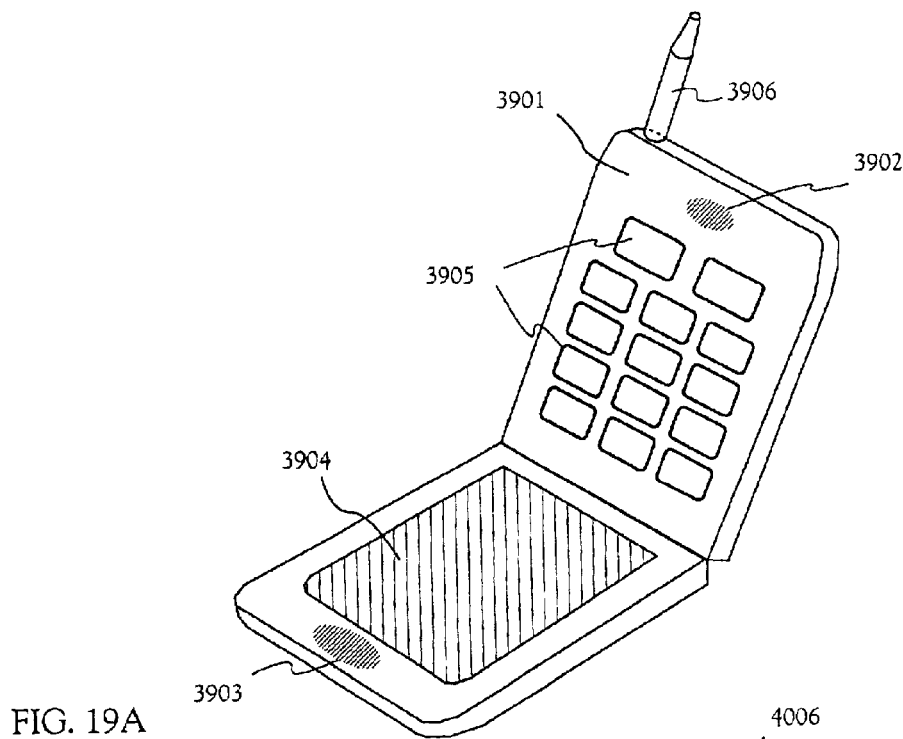
FIGS. 19A to 19C show examples of electronic apparatuses of Embodiment 14.

FIG. 19A shows a mobile telephone which includes a body 3901, a sound output part 3902, a sound input part 3903, a display part 3904, operating switches 3905, an antenna 3906 and the like. The invention can be applied to the display part 3904.

Figure 19B:
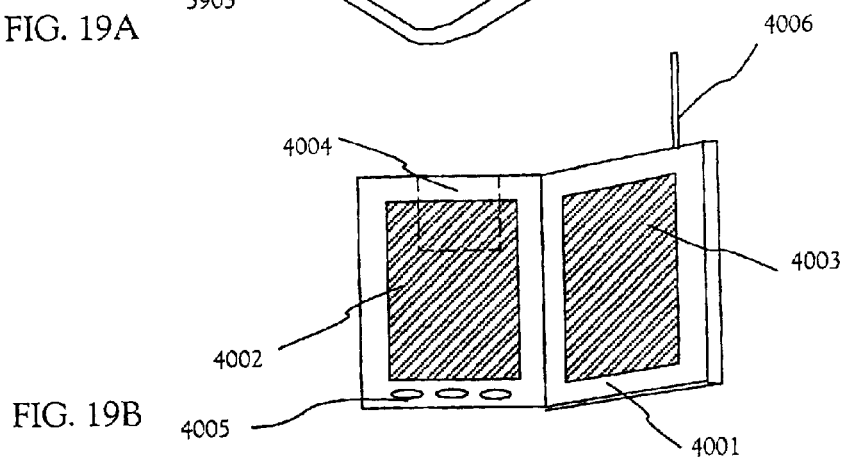

FIG. 19B shows a mobile book (electronic book) which includes body 4001, display parts 4002 and 4003, a storage medium 4004, operating switches 4005, an antenna 4006 and the like. The invention can be applied to the display parts 4002 and 4003.

Figure 19C:
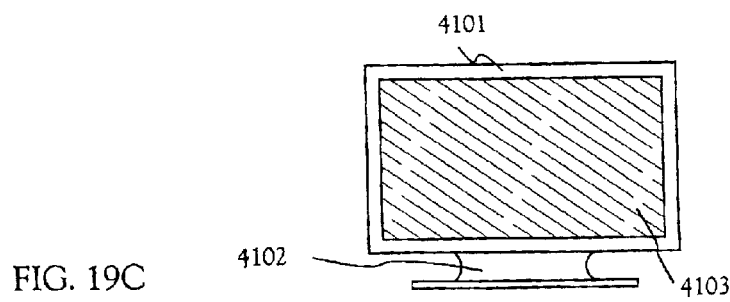

FIG. 19C shows a display which includes a body 4101, a support base 4102, a display part 4103 and the like. The invention can be applied to the display part 4103. The invention is particularly advantageous to a large-screen display, and is advantageous to a display having a diagonal size of 10 inches or more (particularly, 30 inches or more).

As is apparent from the foregoing description, the range of applications of the invention is extremely wide, and the invention can be applied to any category of electronic apparatus. Electronic apparatus according to the invention can be realized by using a construction made of a combination of arbitrary ones of the embodiments 1 to 13.

According to the present invention, TFTs having high mobility can be formed. In addition, the operational characteristic and reliability of a semiconductor device, typified by a high-definition active matrix liquid crystal display device and a light emitting device, can be improved.

What is claimed is:

1. A method of manufacturing a semiconductor device, the method comprising the steps of:
   adding a metal element to an amorphous semiconductor film;
   first heating the amorphous semiconductor film to form a first crystalline semiconductor film;
   irradiating the first crystalline semiconductor film with a laser light to form a second crystalline semiconductor film having a warp;
   second heating the second crystalline semiconductor film at a higher temperature than the first heating step to lessen the warp.

2. The method according to claim 1, wherein an annealing furnace is used in the second heating step.

3. The method according to claim 1, wherein a lamp light is radiated in the second heating step.

4. The method according to claim 3, wherein the lamp light is radiated from at least one of an upper side and a lower side of a substrate.

5. The method according to claim 3, wherein the lamp light is radiated from at least one selected from the group consisting of a halogen lamp, a metal halide lamp, a xenon arc lamp, a carbon arc lamp, a high pressure sodium lamp, and a high pressure mercury lamp.

6. The method according to claim 3, wherein the lamp light is radiated with a temperature rising rate or a temperature lowering rate of 30 to 300° C. per minute.

7. The method according to claim 1, wherein the second crystalline semiconductor film is heated for 1–30 minutes in the second heating step.

8. The method according to claim 1, wherein the metal element comprises at least one selected from the group consisting of Fe, Co, Ni, Ru, Rh, Pd, Os, Ir, Pt, Cu, Ag, Au, Sn and Sb.

9. The method according to claim 1, wherein the laser light is radiated from one selected from the group consisting of a pulse oscillation type excimer laser, a pulse oscillation type YAG laser, a pulse oscillation type YVO4 laser, a pulse oscillation type YAlO3 laser, a pulse oscillation type YLF laser, a continuous emission type excimer laser, a continuous emission type YAG laser, a continuous omission type YVO4 laser, a continuous emission type YAlO3 laser, and a continuous emission type YLF laser.

10. The method according to claim 1, wherein the laser light has one of a rectangular shape and a linear shape on an irradiation plane.

11. A The method according to claim 1, wherein the amorphous semiconductor film is formed through one of a sputtering method and an LPCVD method.

12. The method according to claim 1, wherein the amorphous semiconductor film is formed through a plasma CVD method at a temperature in a range of 400° C. or higher.

13. The method according to claim 1, wherein the semiconductor device is one selected from the group consisting of a personal computer, a video camera, a mobile computer, a goggle type display, a player using a recording medium, a digital camera, a front type projector, a rear type projector, a mobile telephone, a mobile book, and a display.

14. A method of manufacturing a semiconductor device, the method comprising the steps of:
   adding a metal element to an amorphous semiconductor film;
   first heating the amorphous semiconductor film to form a first crystalline semiconductor film;
   irradiating the first crystalline semiconductor film with a laser light to form a second crystalline semiconductor film having a warp;
   second heating the second crystalline semiconductor film at a higher temperature than the first heating step to lessen the warp;
   etching the second crystalline semiconductor film after the second heating step to form a crystalline semiconductor island.

15. The method according to claim 14, wherein the laser light is radiated from one selected from the group consisting of a pulse oscillation type excimer laser, a pulse osculation type YAG laser, a pulse oscillation type YVO4 laser, a pulse oscillation type YAlO3 laser, a pulse oscillation type YLF laser, a continuous emission type excimer laser, a continuous emission type YAG laser, a continuous emission type YVO4 laser, a continuous emission type YAlO3 laser, and a continuous emission type YLF laser.

16. The method according to claim 14, wherein the laser light has one of a rectangular shape and a linear shape on an irradiation plane.

17. The method according to claim 14, wherein an annealing furnace is used in the second heating step.

18. The method according to claim 14, wherein a lamp light is radiated in the second heating step.

19. The method according to claim 18, wherein the lamp light is radiated from at least one of an upper side and a lower side of a substrate.

20. The method according to claim 18, wherein the lamp light is radiated from at least one selected from the group consisting of a halogen lamp, a metal halide lamp, a xenon arc lamp, a carbon arc lamp, a high pressure sodium lamp, and a high pressure mercury lamp.

21. The method according to claim 18, wherein the lamp light is radiated with a temperature rising rate or a temperature lowering rate of 30 to 300° C. per minute.

22. The method according to claim 14, wherein the second crystalline semiconductor film is heated for 1–30 minutes in the second heating stop.

23. The method according to claim 14,
wherein the amorphous semiconductor film is formed through one of a sputtering method and an LPCVD method.

24. A Jim method according to claim 14,
wherein the amorphous semiconductor film is formed through a plasma CVD method at a temperature in a range of 400° C. or higher.

25. The method according to claim 14,
wherein the metal element comprises at least one selected from the group consisting of Fe, Co, Ni, Ru, Rh, Pd, Os, Ir, Pt, Cu, Ag, Au, Sn and Sb.

26. The method according to claim 14,
wherein the semiconductor device is one selected from the group consisting of a personal computer, a video camera, a mobile computer, a goggle type display, a player using a recording medium, a digital camera, a front type projector, a rear type projector, a mobile telephone, a mobile book, and a display.

27. A method of manufacturing a semiconductor device, the method comprising the steps of:
adding a metal element to an amorphous semiconductor film;
first heating the amorphous semiconductor film to form a first crystalline semiconductor film;
irradiating the first crystalline semiconductor film with a laser light to form a second crystalline semiconductor film having a warp;
etching the second crystalline semiconductor film to form a crystalline semiconductor island;
second heating the crystalline semiconductor island at a higher temperature than the first heating step to lessen the warp.

28. The method according to claim 27,
wherein the laser light is radiated from one selected from the group consisting of a pulse oscillation type excimer laser, a pulse oscillation type YAG laser, a pulse oscillation type YVO4 laser, a pulse oscillation type YAlO3 laser, a pulse oscillation type YLF laser, a continuous emission type excimer laser, a continuous emission type YAG laser, a continuous emission type YVO4 laser, a continuous emission type YAlO3 laser, and a continuous emission type YLF laser.

29. The method according to claim 27,
wherein the laser light has one of a rectangular shape and a linear shape on an irradiation plane.

30. The method according to claim 27,
wherein an annealing furnace is used in the second heating step.

31. The method according to claim 27,
wherein a lamp light is radiated in the second heating step.

32. The method according to claim 31,
wherein the lamp light is radiated from at least one of an upper side and a lower side of a substrate.

33. The method according to claim 31,
wherein the lamp light is radiated from at least one selected from the group consisting of a halogen lamp, a metal halide lamp, a xenon arc lamp, a carbon arc lamp, a high pressure sodium lamp, and a high pressure mercury lamp.

34. The method according to claim 31,
wherein the lamp light is radiated with a temperature rising rate or a temperature lowering rate of 30 to 300° C. per minute.

35. The method according to claim 27,
wherein the crystalline semiconductor island is heated for 1–30 minutes in the second heating step.

36. The method according to claim 27,
wherein the amorphous semiconductor film is formed through one of a sputtering method and an LPCVD method.

37. The method according to claim 27,
wherein the amorphous semiconductor film is formed through a plasma CVD method at a temperature in a range of 400° C. or higher.

38. The method according to claim 27,
wherein the metal element comprises at least one selected from the group consisting of Fe, Co, Ni, Ru, Rh, Pd, Os, Ir, Pt, Cu, Ag, Au, Sn and Sb.

39. The method according to claim 27,
wherein the semiconductor device is one selected from the group consisting of a personal computer, a video camera, a mobile computer, a goggle type display, a player us a recording medium, a digital camera, a front type projector, a rear type projector, a mobile telephone, a mobile book, and a display.

40. A method of manufacturing a semiconductor device, the method comprising the steps of:
irradiating a semiconductor film with a laser light to improve crystallinity of the semiconductor film wherein a warp is created in the semiconductor film due to the irradiating with the laser light;
heating the semiconductor film in order to decrease the warp; and
etching the semiconductor film to form at least one semiconductor island after the heating step.

41. The method according to claim 40,
wherein the semiconductor film comprises amorphous silicon.

42. The method according to claim 40,
wherein the semiconductor film is crystallized before the irradiating with the laser light.

43. The method according to claim 40,
wherein the semiconductor film is crystallized before the irradiation with the laser light where the crystallization of the semiconductor film is promoted by adding a metal element thereto.

44. The method according to claim 40,
wherein the semiconductor film comprises amorphous silicon.

45. The method according to claim 40,
wherein the semiconductor film is crystallized before the irradiation with the laser light.

46. The method according to claim 40,
wherein the semiconductor film is crystallized before the irradiation with the laser light where the crystallization of the semiconductor film is promoted by adding a metal element thereto.

47. A method of manufacturing a semiconductor device, the method comprising the steps of:
irradiating a semiconductor film with a laser light to improve crystallinity of the semiconductor film wherein a warp is created in the semiconductor film due to the irradiating with the laser light;
etching the semiconductor film to form at least one semiconductor island; and
heating the semiconductor film in order to decrease the warp after the etching step.

* * * * *